United States Patent
Gelman et al.

(10) Patent No.: US 10,795,316 B2
(45) Date of Patent: Oct. 6, 2020

(54) WIDE FIELD OF VIEW HYBRID HOLOGRAPHIC DISPLAY

(71) Applicant: Real View Imaging Ltd., Yokneam (IL)

(72) Inventors: Shaul Alexander Gelman, Raanana (IL); Carmel Rotschild, Ganei-Tikva (IL); Aviad Kaufman, Zikhron-Yaakov (IL)

(73) Assignee: Real View Imaging Ltd., Yokneam (IL)

( * ) Notice: Subject to any disclaimer, the term of this patent is extended or adjusted under 35 U.S.C. 154(b) by 32 days.

(21) Appl. No.: 16/078,638

(22) PCT Filed: Feb. 22, 2017

(86) PCT No.: PCT/IL2017/050224
§ 371 (c)(1),
(2) Date: Aug. 22, 2018

(87) PCT Pub. No.: WO2017/145154
PCT Pub. Date: Aug. 31, 2017

(65) Prior Publication Data
US 2019/0049899 A1    Feb. 14, 2019

Related U.S. Application Data

(60) Provisional application No. 62/298,070, filed on Feb. 22, 2016, provisional application No. 62/410,494, filed on Oct. 20, 2016.

(51) Int. Cl.
*G03H 1/22* (2006.01)
*G03H 1/02* (2006.01)
(Continued)

(52) U.S. Cl.
CPC ....... *G03H 1/2294* (2013.01); *G02B 26/0841* (2013.01); *G02B 27/0103* (2013.01);
(Continued)

(58) Field of Classification Search
CPC ...... G03H 1/2294; G03H 1/02; G03H 1/2205; G03H 1/2249; G02B 26/0841; G02B 27/0103; G03F 7/70958; H04N 5/66
See application file for complete search history.

(56) References Cited

U.S. PATENT DOCUMENTS 3,800,298 A    3/1974 Ogura et al.
4,978,952 A    12/1990 Irwin
(Continued)

FOREIGN PATENT DOCUMENTS

| GB | 2472773 | 3/2011 |
| GB | 2507462 | 5/2014 |

(Continued)

OTHER PUBLICATIONS

Communication Pursuant to Article 94(3) EPC dated Jul. 19, 2019 From the European Patent Office Re. Application No. 17714566.1. (5 Pages).

(Continued)

*Primary Examiner* — Mishawn N. Hunter

(57) ABSTRACT

A display for displaying a wide Field of View (FoV) scene including a holographic image within the scene, including a first Spatial Light Modulator (SLM) and an optical system for producing a first holographic image at a center of a displayed scene, and a second image display for producing at least a first additional image adjacent to the first holographic image. In some embodiments an augmented reality display is used for the displaying of the first holographic image at the center of a field of view and the second image adjacent to the first holographic image. In some embodi- (Continued)

ments a virtual reality display is used for the displaying of the first holographic image near the center of a field of view and the second image adjacent to the first holographic image. Related apparatus and methods are also described.

23 Claims, 10 Drawing Sheets

(51) Int. Cl.
*G02B 26/08* (2006.01)
*G03F 7/20* (2006.01)
*H04N 5/66* (2006.01)
*G02B 27/01* (2006.01)

(52) U.S. Cl.
CPC ........... *G03F 7/70958* (2013.01); *G03H 1/02* (2013.01); *G03H 1/2205* (2013.01); *G03H 1/2249* (2013.01); *H04N 5/66* (2013.01); *G02B 2027/0174* (2013.01); *G03H 2001/2236* (2013.01); *G03H 2001/2284* (2013.01); *G03H 2225/60* (2013.01); *G03H 2226/05* (2013.01); *G03H 2227/02* (2013.01); *G03H 2270/55* (2013.01)

(56) References Cited

U.S. PATENT DOCUMENTS

| | | | |
|---|---|---|---|
| 5,369,511 A | 11/1994 | Amos | |
| 5,673,146 A | 9/1997 | Kelly | |
| 5,844,709 A * | 12/1998 | Rabinovich | B82Y 20/00 359/248 |
| 5,883,743 A * | 3/1999 | Sloan | G02B 27/46 359/29 |
| 6,101,007 A | 8/2000 | Yamasaki et al. | |
| 6,876,878 B2 | 4/2005 | Zhdanov | |
| 6,906,836 B2 | 6/2005 | Parker et al. | |
| 7,259,898 B2 | 8/2007 | Khazova et al. | |
| 7,522,344 B1 | 4/2009 | Curatu et al. | |
| 7,639,208 B1 | 12/2009 | Ha et al. | |
| 7,675,684 B1 | 3/2010 | Weissman et al. | |
| 8,159,733 B2 | 4/2012 | Christmas et al. | |
| 8,213,064 B2 | 7/2012 | Yona et al. | |
| 8,500,284 B2 | 8/2013 | Rotschild et al. | |
| 8,576,276 B2 | 11/2013 | Bar-Zeev et al. | |
| 8,976,170 B2 | 3/2015 | Lee et al. | |
| 8,982,471 B1 * | 3/2015 | Starner | G02B 5/30 359/13 |
| 9,225,969 B2 | 12/2015 | Aguirre-Valencia | |
| 2003/0197933 A1 | 10/2003 | Sudo et al. | |
| 2004/0066547 A1 | 4/2004 | Parker et al. | |
| 2004/0150888 A1 | 8/2004 | Domjan et al. | |
| 2005/0013005 A1 | 1/2005 | Rogers | |
| 2006/0176242 A1 | 8/2006 | Jaramaz et al. | |
| 2007/0177275 A1 | 8/2007 | McGuire, Jr. | |
| 2008/0013793 A1 | 1/2008 | Hillis et al. | |
| 2008/0174659 A1 | 7/2008 | McDowall | |
| 2009/0002787 A1 | 1/2009 | Cable et al. | |
| 2009/0164930 A1 | 6/2009 | Chen et al. | |
| 2009/0237759 A1 | 9/2009 | Maschke | |
| 2009/0238060 A1 * | 9/2009 | Yasuda | G11B 7/0065 369/103 |
| 2010/0110368 A1 | 5/2010 | Chaum | |
| 2010/0133424 A1 | 6/2010 | Lindsay | |
| 2010/0238270 A1 | 9/2010 | Bjelkhagen et al. | |
| 2011/0128555 A1 | 6/2011 | Rotschild et al. | |
| 2011/0157667 A1 * | 6/2011 | Lacoste | G02B 27/2271 359/9 |
| 2012/0052946 A1 | 3/2012 | Yun | |
| 2012/0139817 A1 | 6/2012 | Freeman | |
| 2012/0140038 A1 | 6/2012 | Bi et al. | |
| 2012/0188619 A1 | 7/2012 | Song et al. | |
| 2012/0224062 A1 | 9/2012 | Lacoste et al. | |
| 2013/0137076 A1 | 5/2013 | Perez et al. | |
| 2013/0222384 A1 | 8/2013 | Futterer | |
| 2013/0265622 A1 | 10/2013 | Christmas et al. | |
| 2013/0300728 A1 | 11/2013 | Reichow et al. | |
| 2013/0326364 A1 | 12/2013 | Latta et al. | |
| 2014/0002367 A1 * | 1/2014 | Gluckstad | G02B 27/017 345/168 |
| 2014/0033052 A1 | 1/2014 | Kaufman et al. | |
| 2014/0146394 A1 * | 5/2014 | Tout | G09B 9/307 359/630 |
| 2014/0160543 A1 | 6/2014 | Putilin et al. | |
| 2014/0372944 A1 | 12/2014 | Mulcahy et al. | |
| 2015/0016777 A1 | 1/2015 | Abovitz et al. | |
| 2015/0168914 A1 | 6/2015 | Gelman et al. | |
| 2015/0206350 A1 | 7/2015 | Gardes et al. | |
| 2015/0234095 A1 | 8/2015 | Schowengerdt | |
| 2015/0250450 A1 | 9/2015 | Thomas et al. | |
| 2015/0332508 A1 | 11/2015 | Jovanovic | |
| 2015/0378080 A1 | 12/2015 | Georgiou et al. | |
| 2016/0033771 A1 | 2/2016 | Tremblay et al. | |
| 2016/0077344 A1 | 3/2016 | Burns | |
| 2016/0143528 A1 | 5/2016 | Wilf et al. | |
| 2016/0147308 A1 | 5/2016 | Gelman et al. | |
| 2016/0216515 A1 | 7/2016 | Bouchier et al. | |
| 2016/0223986 A1 | 8/2016 | Archambeau et al. | |
| 2016/0260441 A1 | 9/2016 | Muehlhausen et al. | |
| 2016/0360187 A1 | 12/2016 | Smithwick et al. | |
| 2016/0366399 A1 | 12/2016 | Tempel et al. | |
| 2016/0379606 A1 | 12/2016 | Kollin et al. | |
| 2017/0052373 A1 | 2/2017 | Memmott et al. | |
| 2017/0078652 A1 | 3/2017 | Hua et al. | |
| 2019/0004478 A1 | 1/2019 | Gelman et al. | |
| 2019/0056693 A1 | 2/2019 | Gelman et al. | |
| 2019/0155033 A1 | 5/2019 | Gelman et al. | |

FOREIGN PATENT DOCUMENTS

| | | |
|---|---|---|
| WO | WO 2005/045531 | 5/2005 |
| WO | WO 2006/008734 | 1/2006 |
| WO | WO 2009/126264 | 10/2009 |
| WO | WO 2009/156752 | 12/2009 |
| WO | WO 2011/018655 | 2/2011 |
| WO | WO 2012/062681 | 5/2012 |
| WO | WO 2012/166593 | 12/2012 |
| WO | WO 2013/112705 | 8/2013 |
| WO | WO 2013/163347 | 10/2013 |
| WO | WO 2014/106823 | 7/2014 |
| WO | WO 2014/155288 | 10/2014 |
| WO | WO 2014/186620 | 11/2014 |
| WO | WO 2015/004670 | 1/2015 |
| WO | WO 2015/164402 | 10/2015 |
| WO | WO 2016/010289 | 1/2016 |
| WO | WO 2016/105281 | 6/2016 |
| WO | WO 2016/105282 | 6/2016 |
| WO | WO 2016/105285 | 6/2016 |
| WO | WO 2016/144459 | 9/2016 |
| WO | WO 2016/156614 | 10/2016 |
| WO | WO 2007/145156 | 8/2017 |
| WO | WO 2017/145154 | 8/2017 |
| WO | WO 2017/145155 | 8/2017 |
| WO | WO 2017/145156 | 8/2017 |
| WO | WO 2017/145158 | 8/2017 |
| WO | WO 2018/154564 | 8/2018 |
| WO | WO 2018/211494 | 11/2018 |

OTHER PUBLICATIONS

Nicolau et al. "An Augmented Reality System for Liver Theraml Ablation: Design and Evaluation on Clinical Cases", Medical Image Analysis, 13(3): 494-506, Available Online Feb. 20, 2009.
Nicolau et al. "Augmented Reality in Laparoscopic Surgical Oncology", Surgical Oncology, 20(3): 189-201, Sep. 2011.
International Preliminary Report on Patentability dated Nov. 28, 2019 From the International Bureau of WIPO Re. Application No. PCT/IL2018/050509. (16 Pages).
Communication Relating to the Results of the Partial International Search and Provisional Opinion dated May 8, 2017 From the

(56) References Cited

OTHER PUBLICATIONS

International Searching Authority Re. Application No. PCT/IL2017/050226. (16 Pages).
Communication Relating to the Results of the Partial International Search and the Provisional Opinion dated May 15, 2017 From the International Searching Authority Re. Application No. PCT/IL2017/050228. (14 Pages).
International Preliminary Report on Patentability dated Sep. 7, 2018 From the International Bureau of WIPO Re. Application No. IL2017/050228. (11 Pages).
International Preliminary Report on Patentability dated Sep. 7, 2018 From the International Bureau of WIPO Re. Application No. PCT/IL2017/050225. (10 Pages).
International Preliminary Report on Patentability dated Sep. 7, 2018 From the International Bureau of WIPO Re. Application No. PCT/IL2017/050226. (14 Pages).
International Search Report and the Written Opinion dated May 4, 2017 From the International Searching Authority Re. Application No. PCT/IL2017/050225. (16 Pages).
International Search Report and the Written Opinion dated Sep. 7, 2017 From the International Searching Authority Re. Application No. PCT/IL2017/050226. (21 Pages).
International Search Report and the Written Opinion dated Jul. 9, 2018 From the International Searching Authority Re. Application No. PCT/IL2018/050186. (19 Pages).
International Search Report and the Written Opinion dated Aug. 10, 2017 From the International Searching Authority Re. Application No. IL2017/050228. (17 Pages).
International Search Report and the Written Opinion dated Sep. 25, 2018 From the International Searching Authority Re. Application No. PCT/IL2018/050509. (24 Pages).
International Search Report and the Written Opinion dated Apr. 26, 2017 From the International Searching Authority Re. Application No. PCT/IL2017/050224. (14 Pages).
International Search Report and the Written Opinion dated Jun. 29, 2017 From the International Searching Authority Re. Application No. PCT/IL2017/050226. (20 Pages).
Bimber "Holographics Combining Holograms With Interactive Computer Graphics", Retrieved From Holographer.org, 32 P., Apr. 2004.
Bimber "HoloGraphics: Combining Holograms With Interactive Computer Graphics", Retrieved From Holographer.org, p. 1-9, Apr. 2004.
Bimber "Merging Graphics and Holograms", Journal of Holography and Speckle, 3(2): 1-7, Dec. 2006.
Bimber et al. "Interacting With Augmented Holograms", Integrated Optoelectronic Devices, 2005: 41-54, Apr. 21, 2005.
Duchowski et al. "Measuring Gaze Depth With an Eye Tracker During Stereoscopic Display", Proceeding of the ACM SIGGRAPH Symposium on Applied Perception in Graphics and Visualization, APGV'11, Toulouse, France, Aug. 27-28, 2011, p. 15-22, Aug. 27, 2011.
Galeotti et al. "In-Situ Visualization of Medical Images Using Holographic Optics", Proceedings of the Augmented Environments for Medical Imaging Including Augmented Reality in Computer-Aided Surgery (AMI ARCS), at Medical Image Computing and Computer-Assisted Intervention (MICCAI), New York City, p. 93-103, Sep. 10, 2008.
Goodman "Computer-Generated Holograms", Introduction to Fourier Optics, 3rd Ed., Chap.9.9: 355-359, 2005.
Jud et al. "Motion Tracking Systems. An Overview of Motion Tracking Methods", Studies on Mechatronics, Swiss Federal Institute of Technology Zurich, Switzerland, ETH, Chap.1-5: 1-81, Spring 2011.
Liao et al. "3-D Augmented Reality for MRI-Guided Surgery Using Integral Videography Autostereoscopic Image Overlay", IEEE Transactions on Biomedical Engineering, XP011343257, 57(6): 1476-1486, Jun. 2010.
Moon et al. "Holographic Head-Mounted Display With RGB Light Emitting Diode Light Source", Optics Express, 22(6): 6526-6534, Published Online Mar. 13, 2014.
Yeh "Optics of Periodic Layered Media: Bragg Reflectors", Optical Waves in Layered Media, Chap.6.3: 128-134, Feb. 2005.
Official Action dated Oct. 28, 2019 From the US Patent and Trademark Office Re. U.S. Appl. No. 16/078,639. (29 Pages).
International Preliminary Report on Patentability dated Sep. 6, 2019 From the International Bureau of WIPO Re. Application No. PCT/IL2018/050186. (11 Pages).
Communication Pursuant to Article 94(3) EPC dated Jul. 30, 2019 From the European Patent Office Re. Application No. 17712554.9. (5 Pages).
Communication Pursuant to Article 94(3) EPC dated Mar. 27, 2020 From the European Patent Office Re. Application No. 17714566.1. (5 Pages).
Official Action dated Apr. 16, 2020 from the US Patent and Trademark Office Re. U.S. Appl. No. 16/106,249. (39 pages).

* cited by examiner

WIDE FIELD OF VIEW HYBRID HOLOGRAPHIC DISPLAY

RELATED APPLICATIONS

This application is a National Phase of PCT Patent Application No. PCT/IL2017/050224 having International filing date of Feb. 22, 2017, which claims the benefit of priority under 35 USC § 119(e) of U.S. Provisional Patent Application No. 62/298,070 filed on Feb. 22, 2016 and of U.S. Provisional Patent Application No. 62/410,494 filed on Oct. 20, 2016. The contents of the above applications are all incorporated by reference as if fully set forth herein in their entirety.

FIELD AND BACKGROUND OF THE INVENTION

The present invention, in some embodiments thereof, relates to a holographic display with a wide field of view, and, more particularly, but not exclusively, to a display displaying a holographic image at a center of a field of view, surrounded by a second, different image surrounding the holographic image further away from the center of the field of view.

The disclosures of all references mentioned above and throughout the present specification, as well as the disclosures of all references mentioned in those references, are hereby incorporated herein by reference.

SUMMARY OF THE INVENTION

An aspect of some embodiments of the invention involves displaying a first holographic image near a center of a field of view, and a second, different image adjacent to the first holographic image.

In some embodiments the second image surrounds the first holographic image.

In some embodiments an augmented reality display is used for the displaying of the first holographic image near the center of a field of view and the second image adjacent to the first holographic image.

In some embodiments a virtual reality display is used for the displaying of the first holographic image near the center of a field of view and the second image adjacent to the first holographic image.

In some embodiments an augmented reality display is used for the displaying which additionally lets in a view of the real world in at least part of the field of view.

According to an aspect of some embodiments of the present invention there is provided a display for displaying a wide Field of View (FoV) scene including a holographic image within the scene, including a first Spatial Light Modulator (SLM) and an optical system for producing a first holographic image at a center of a displayed scene, and a second image display for producing at least a first additional image adjacent to the first holographic image.

According to some embodiments of the invention, the optical system is configured to display the first holographic image spanning a Field of View (FoV) of a human fovea.

According to some embodiments of the invention, the optical system is configured to display the first holographic image spanning an angle in a range of 5-35 degrees.

According to some embodiments of the invention, further including a viewer pupil tracking component for tracking the viewer's pupil and wherein the viewer pupil tracking component provides data for controlling the first Spatial Light Modulator (SLM) and the optical system for displaying the first holographic image to the viewer's pupil.

According to some embodiments of the invention, the second image display includes a lower spatial resolution display than the first SLM. According to some embodiments of the invention, the second image display is configured to display a lower spatial resolution image than the first SLM. According to some embodiments of the invention, the second image display includes a display for producing a stereoscopic image. According to some embodiments of the invention, the second image display includes an SLM for producing a holographic image.

According to some embodiments of the invention, the optical system for producing the first holographic image and the second image display for producing the first additional image are configured to display the first holographic image and the first additional image spanning an angle in a range of 60-110 degrees.

According to some embodiments of the invention, further including a third image display for producing at least a second additional image. According to some embodiments of the invention, the third image display for producing the second additional image produces the second additional image adjacent to the first additional image.

According to some embodiments of the invention, the optical system for producing the first holographic image and the second image display and the third image display are configured to display the first holographic image and the first additional image and the second additional image spanning an angle in a range of 60-110 degrees.

According to some embodiments of the invention, the third image display includes a display for producing a stereoscopic image.

According to some embodiments of the invention, the first SLM and the optical system for producing the first holographic image includes two SLMs and two optical systems, for producing two first holographic images, one for each one of a viewer's two eyes, and the second image display for producing the at least a first additional image adjacent to the first holographic image includes two second image displays for producing at least two first additional images each one adjacent to each one of the first holographic images.

According to some embodiments of the invention, the two SLMs, the two optical systems, and the two image displays are configured to display the first holographic image and the first additional image to the viewer's two eyes spanning an angle in a range of 90-200 degrees.

According to some embodiments of the invention, the display described above are included in a Head Mounted Display (HMD).

According to an aspect of some embodiments of the present invention there is provided a display for displaying a wide Field of View (FoV) scene including a holographic image within the scene, including a first Spatial Light Modulator (SLM) and an optical system for producing a first holographic image, and a second image display for producing at least a first additional image adjacent to the first holographic image.

According to an aspect of some embodiments of the present invention there is provided a method for displaying a wide Field of View (FoV) scene including a holographic image within the scene, including displaying a first holographic image at a center of a displayed scene, and displaying a first additional image as part of the displayed scene and adjacent to the first holographic image.

According to some embodiments of the invention, the displaying the first holographic image includes using a first Spatial Light Modulator (SLM) and an optical system for producing the first holographic image.

According to some embodiments of the invention, the displaying the first holographic image includes displaying the first holographic image to span a Field of View (FoV) of a human fovea.

According to some embodiments of the invention, the displaying the first holographic image includes displaying the first holographic image to span an angle in a range of 5-35 degrees.

According to some embodiments of the invention, further including tracking a viewer's pupil, and controlling the displaying the first holographic image to display the first holographic image to the viewer's pupil.

According to some embodiments of the invention, the first additional image includes a lower spatial resolution display than the first holographic image. According to some embodiments of the invention, the first additional image includes a stereoscopic image. According to some embodiments of the invention, the first additional image includes a holographic image.

According to some embodiments of the invention, further including displaying a second additional image. According to some embodiments of the invention, the second additional image is displayed adjacent to the first additional image. According to some embodiments of the invention, the second additional image includes a stereoscopic image.

According to some embodiments of the invention, the displaying the first holographic image and the first additional image is performed by a Head Mounted Display (HMD).

According to some embodiments of the invention, the displaying a first holographic image at a center of a displayed scene includes displaying two first holographic images each one at a center of a displayed scene to each one of two eyes, and the displaying a first additional image adjacent to the first holographic image includes displaying two first additional images, each one adjacent to each one of the first holographic images.

According to an aspect of some embodiments of the present invention there is provided a method for displaying a wide Field of View (FoV) scene including a holographic image within the scene, including setting pixel values in a Spatial Light Modulator (SLM) for producing a Computer Generated Hologram (CGH), illuminating the SLM with coherent light, thereby producing a first holographic image, setting pixel values in a first additional image display for producing a second, additional image, and illuminating the first additional image display, thereby producing a second additional image, wherein the first holographic image is displayed at a center of a scene, and the second additional image is displayed as part of the scene and adjacent to the first holographic image.

According to some embodiments of the invention, further including tracking a viewer's pupil, and controlling the displaying the first holographic image to display the first holographic image to the viewer's pupil.

According to some embodiments of the invention, the second additional image includes a lower spatial resolution display than the first holographic image.

According to some embodiments of the invention, the second additional image includes a stereoscopic image.

According to some embodiments of the invention, the first additional image display includes a SLM and the first additional image includes a holographic image.

According to some embodiments of the invention, further including a second additional image display and using the second additional image display for displaying a third additional image adjacent to the second additional image.

According to some embodiments of the invention, the displaying the first holographic image and the second additional image is performed by a Head Mounted Display (HMD).

According to some embodiments of the invention, the displaying the first holographic image at the center of a scene includes displaying two first holographic images each one at a center of a displayed scene to each one of two eyes, and the displaying the second additional image adjacent to the first holographic image includes displaying two first additional images, each one adjacent to each one of the first holographic images.

According to an aspect of some embodiments of the present invention there is provided a method for displaying a wide Field of View (FoV) scene including an interference based holographic image within the scene, including setting pixel values in a Spatial Light Modulator (SLM) for producing a Computer Generated Hologram (CGH), illuminating the SLM with coherent light, thereby producing a first interference based holographic image, setting pixel values in a first additional image display for producing a first additional image, illuminating the first additional image display, thereby producing a first additional image, and allowing a real view of a real world to be viewable through and around the first holographic image and the first additional image, wherein the first holographic image is projected toward a viewer's fovea, the first additional image is displayed as part of the scene and adjacent to the first holographic image, and the real view of a real world is also viewable as part of the scene.

According to some embodiments of the invention, further including tracking a viewer's pupil, and controlling the displaying the first holographic image to display the first holographic image to the viewer's pupil.

According to some embodiments of the invention, the first additional image includes a lower spatial resolution display than the first holographic image. According to some embodiments of the invention, the first additional image includes a stereoscopic image. According to some embodiments of the invention, the first additional image includes a 2D image. According to some embodiments of the invention, the first additional image includes an interference based holographic image.

According to some embodiments of the invention, the displaying the first holographic image and the first additional image is performed by a Head Mounted Display (HMD).

According to some embodiments of the invention, further including a second additional image display and using the second additional image display for displaying a second additional image adjacent to the first additional image.

According to some embodiments of the invention, the displaying the first holographic image includes displaying two first holographic images each one to each one of two eyes, and the displaying the second additional image adjacent to the first holographic image includes displaying two first additional images, each one adjacent to each one of the first holographic images.

According to an aspect of some embodiments of the present invention there is provided a hybrid display for displaying a wide Field of View (FoV) scene including an interference based holographic image within the scene, including a head mounted display (HMD) including a first Spatial Light Modulator (SLM) for producing a first interference based holographic image, an optical system for imaging the first holographic image on a controllable tilting mirror, and re-imaging the first holographic image toward a viewer's fovea, a second image display for producing at least a first additional real-time computer generated image, located adjacent to the controllable tilting mirror, arranged to display the first additional image adjacent to the first holographic image, and wherein the optical system is arranged to allow the viewer a real view of a real world through the optical system, thereby combining a view of the first holographic image, the first additional image and the real world.

According to some embodiments of the invention, further including a focusing component for focusing light from the SLM onto a Fourier plane, and wherein the second image display is located at the Fourier plane.

According to some embodiments of the invention, the optical system is configured to display the first holographic image spanning a Field of View (FoV) of a human fovea.

According to some embodiments of the invention, further including a viewer pupil tracking component for tracking the viewer's pupil and wherein the viewer pupil tracking component provides data for controlling the first Spatial Light Modulator (SLM) and the optical system for displaying the first holographic image to the viewer's pupil.

According to some embodiments of the invention, the second image display includes a lower spatial resolution display than the first SLM. According to some embodiments of the invention, the second image display includes a display for producing a stereoscopic image. According to some embodiments of the invention, the second image display includes an SLM for producing a holographic image.

According to some embodiments of the invention, the optical system for producing the first holographic image and the second image display for producing the first additional image are configured to display the first holographic image and the first additional image spanning together a total angle in a range of 60-110 degrees.

According to some embodiments of the invention, further including a third image display for producing at least a second additional image.

According to some embodiments of the invention, the optical system for producing the first holographic image and the second image display and the third image display are configured to display the first holographic image and the first additional image and the second additional image spanning together a total angle in a range of 60-110 degrees.

According to some embodiments of the invention, the first SLM and the optical system for producing the first holographic image includes two SLMs and two optical systems, for producing two first holographic images, one for each one of a viewer's two eyes, and the second image display for producing the at least a first additional image adjacent to the first holographic image includes two second image displays for producing at least two first additional images each one adjacent to each one of the first holographic images.

According to some embodiments of the invention, the two SLMs, the two optical systems, and the two image displays are configured to display the first holographic image and the first additional image to the viewer's two eyes spanning an angle in a range of 90-200 degrees.

According to some embodiments of the invention, included in a Head Mounted Display (HMD).

According to an aspect of some embodiments of the present invention there is provided a display for displaying a wide Field of View (FoV) scene including a holographic image within the scene, including a first Spatial Light Modulator (SLM) and an optical system for producing a first holographic image at a center of a displayed scene, and an image display for producing at least a first additional image adjacent to the first holographic image.

According to some embodiments of the invention, the image display for producing at least a first additional image adjacent to the first holographic image is the first SLM, configured for also producing a second interference based holographic image adjacent to the first holographic image.

According to some embodiments of the invention, the optical system is configured to display the first holographic image spanning a Field of View (FoV) of a human fovea.

According to some embodiments of the invention, the optical system is configured to display the first holographic image spanning an angle in a range of 5-35 degrees.

According to some embodiments of the invention, further including a viewer pupil tracking component for tracking the viewer's pupil and wherein the viewer pupil tracking component provides data for controlling the first Spatial Light Modulator (SLM) and the optical system for displaying the first holographic image to the viewer's pupil.

According to some embodiments of the invention, further including a second image display for producing the first additional image adjacent to the first holographic image, in which the second image display includes a display for producing a stereoscopic image.

According to some embodiments of the invention, the second image display includes an SLM for producing an interference based holographic image.

According to some embodiments of the invention, the optical system for producing the first holographic image and the image display for producing the first additional image are configured to display the first holographic image and the first additional image spanning an angle in a range of 60-110 degrees.

According to some embodiments of the invention, the first SLM and the optical system for producing the first holographic image includes two SLMs and two optical systems, for producing two first holographic images, one for each one of a viewer's two eyes, and the image display for producing the at least a first additional image adjacent to the first holographic image includes two image displays for producing at least two first additional images each one adjacent to each one of the first holographic images.

According to some embodiments of the invention, the two SLMs, the two optical systems, and the two image displays are configured to display the first holographic image and the first additional image to the viewer's two eyes spanning an angle in a range of 90-200 degrees.

According to some embodiments of the invention, the display is included in a Head Mounted Display (HMD).

According to some embodiments of the invention, further including the optical system enabling a real view of a real world through the optical system, thereby combining a view of the first holographic image, the first additional image and the real world.

According to an aspect of some embodiments of the present invention there is provided a display for displaying a wide Field of View (FoV) scene including an interference based holographic image within the scene, including a first Spatial Light Modulator (SLM) and an optical system for producing a first interference based holographic image, and a second image display for producing at least a first additional image adjacent to the first holographic image.

According to an aspect of some embodiments of the present invention there is provided a method for displaying a wide Field of View (FoV) scene including an interference based holographic image within the scene, including displaying a first interference based holographic image, and displaying a first additional image as part of the displayed scene and adjacent to the first holographic image.

According to some embodiments of the invention, a display for displaying the first additional image is located next to a location of the first holographic image.

According to some embodiments of the invention, the displaying the first holographic image includes displaying the first holographic image at a center of a displayed scene.

According to some embodiments of the invention, the displaying the first holographic image includes using a first Spatial Light Modulator (SLM) and an optical system for producing the first holographic image.

According to some embodiments of the invention, the displaying the first holographic image includes displaying the first holographic image to a viewer's span a Field of View (FoV) of a human fovea.

According to some embodiments of the invention, the displaying the first holographic image includes displaying the first holographic image to span an angle in a range of 5-35 degrees.

According to some embodiments of the invention, the displaying the first additional image includes displaying the first additional image to a viewer's retina outside a fovea of an eye of the viewer.

According to some embodiments of the invention, further including displaying a second additional image. According to some embodiments of the invention, the second additional image is displayed adjacent to the first additional image.

According to some embodiments of the invention, further including enabling a real view of a real world to be viewable through and around the first holographic image and the first additional image, wherein the first holographic image is displayed at a center of a scene, the second additional image is displayed as part of the scene and adjacent to the first holographic image, and the real view of a real world is also viewable as part of the scene.

According to some embodiments of the invention, the second additional image includes a stereoscopic image.

According to an aspect of some embodiments of the present invention there is provided a method for displaying a wide Field of View (FoV) scene including a holographic image within the scene, including setting pixel values in a Spatial Light Modulator (SLM) for producing a Computer Generated Hologram (CGH), illuminating the SLM with coherent light, thereby producing a first interference based holographic image, setting pixel values in a first additional image display for producing a second image, and illuminating the first additional image display, thereby producing a second additional image, wherein the first holographic image is displayed at a center of a scene, and the second additional image is displayed as part of the scene and adjacent to the first holographic image.

According to some embodiments of the invention, further including tracking a viewer's pupil, and controlling the displaying the first holographic image to display the first holographic image to the viewer's pupil.

According to some embodiments of the invention, further including allowing a real view of a real world to be viewable around the first holographic image and the second, additional image, wherein the first holographic image is displayed at a center of a scene, the second additional image is displayed as part of the scene and adjacent to the first holographic image, and the real view of a real world is also viewable as part of the scene.

According to some embodiments of the invention, the allowing the real view of a real world to be viewable around the first holographic image and the second, additional image includes allowing the real view of a real world to be viewable through and around the first holographic image and the second, additional image.

Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

Implementation of the method and/or system of embodiments of the invention can involve performing or completing selected tasks manually, automatically, or a combination thereof. Moreover, according to actual instrumentation and equipment of embodiments of the method and/or system of the invention, several selected tasks could be implemented by hardware, by software or by firmware or by a combination thereof using an operating system.

For example, hardware for performing selected tasks according to embodiments of the invention could be implemented as a chip or a circuit. As software, selected tasks according to embodiments of the invention could be implemented as a plurality of software instructions being executed by a computer using any suitable operating system. In an exemplary embodiment of the invention, one or more tasks according to exemplary embodiments of method and/or system as described herein are performed by a data processor, such as a computing platform for executing a plurality of instructions. Optionally, the data processor includes a volatile memory for storing instructions and/or data and/or a non-volatile storage, for example, a magnetic hard-disk and/or removable media, for storing instructions and/or data. Optionally, a network connection is provided as well. A display and/or a user input device such as a keyboard or mouse are optionally provided as well.

BRIEF DESCRIPTION OF THE SEVERAL VIEWS OF THE DRAWINGS

Some embodiments of the invention are herein described, by way of example only, with reference to the accompanying drawings. With specific reference now to the drawings in detail, it is stressed that the particulars shown are by way of example and for purposes of illustrative discussion of embodiments of the invention. In this regard, the description taken with the drawings makes apparent to those skilled in the art how embodiments of the invention may be practiced.

In the drawings.

DESCRIPTION OF SPECIFIC EMBODIMENTS OF THE INVENTION

Figure 1A:
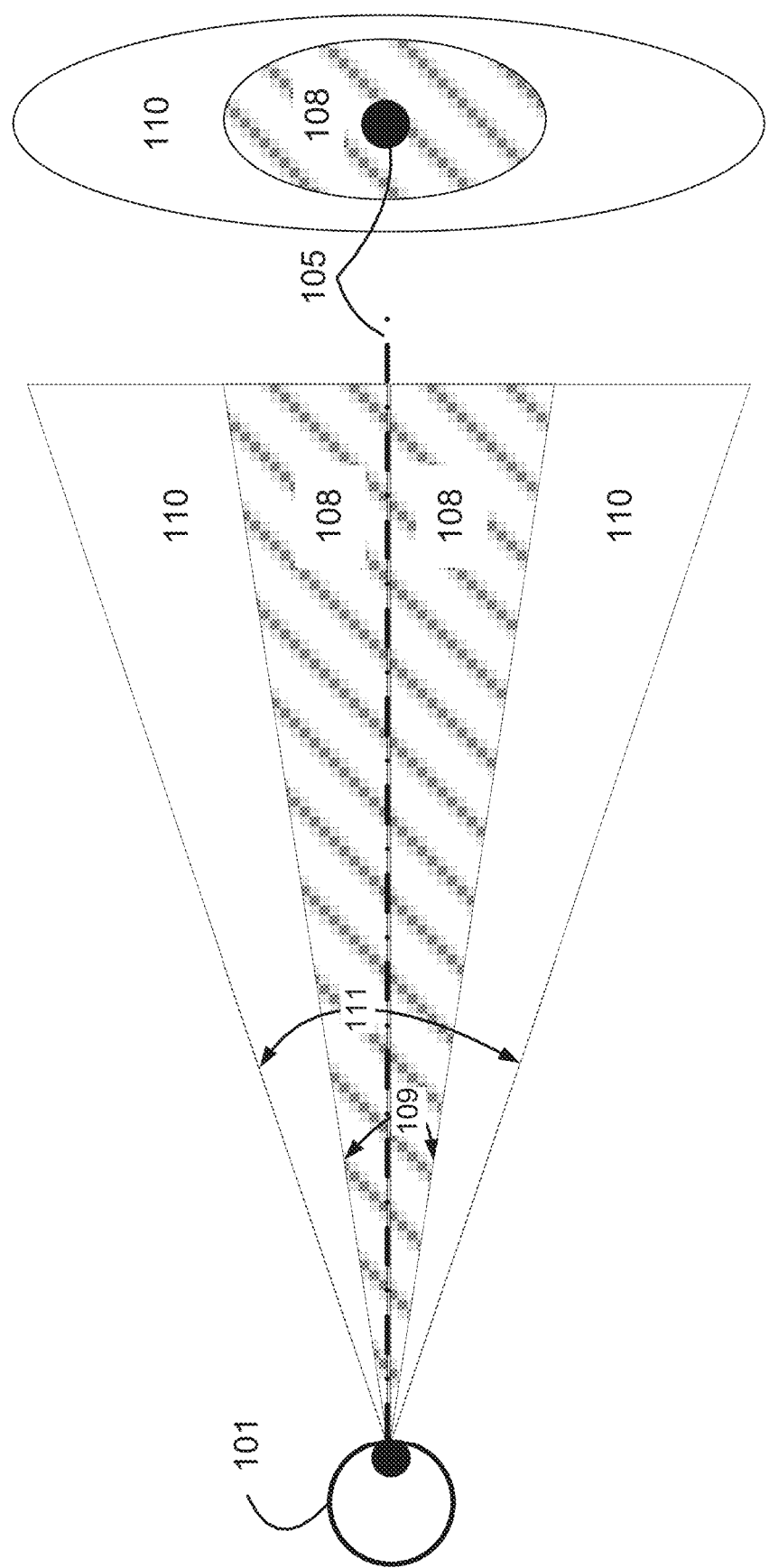
FIG. 1A is a simplified illustration of a various portions of a Field of View (FoV) of an eye relative to a center of the FoV, according to an example embodiment of the invention.

The present invention, in some embodiments thereof, relates to a holographic display with a wide field of view, and, more particularly, but not exclusively, to a display displaying a first holographic image at a center of a field of view, adjacent to a second, different image further away from the center of the field of view.

In some embodiments the second image surrounds the first holographic image.

In some embodiments an augmented reality display is used for the displaying of the first holographic image near the center of a field of view, and the second image adjacent to the first holographic image.

In some embodiments a virtual reality display is used for the displaying of the first holographic image near the center of a field of view, and the second image adjacent to the first holographic image.

The term "holographic image" in the present specification and claims is used to mean an interference based holographic image, that is, an interference based holographic image produced by light interacting with a fringe pattern.

The term "adjacent", when used in the present specification and claims with reference to an image being adjacent to another image, means "nearby visually". The term can mean adjacent and touching or adjacent but not touching. The term can mean adjacent in any one of the three directions—azimuth, elevation or distance/depth.

Overview

Three dimensional (3D) display is an emerging technology, as is 3D Head Mounted Display (HMD). Current 3D HMDs are based on stereoscopic 3D display. However, in stereoscopic 3D displays a scene is actually at focus at one specific distance, and fools the eye into perceiving distance based on eye convergence. Such displays do not provide an eye with an eye focus accommodation depth cue, resulting in a confusing appearance of a 3D object, resulting in what known in the literature as vergence-accommodation conflict that reduces the viewing and interaction user experience that can sometimes result with nausea or headache for the user.

A holographic display is an optically true display which presents light with light wave phase and intensity information the same as light coming off a real object/scene, for example including all the natural depth cues which are provided by real objects in the real world, such as, by way of a non-limiting example, eye focus accommodation and eye convergence potentially eliminating the vergence-accommodation conflict.

Due to a large pixel size of a Spatial Light Modulator (SLM) relative to optical wavelengths, a Field of View (FoV) of a Computer Generated Holographic (CGH) image produced by a SLM is relatively narrow. In some embodiments a wide FoV is achieved by displaying a central holographic image adjacent to, and/or peripheral to, and/or surrounded by one or more additional images, producing a scene with a wider FoV than just the central holographic image, potentially providing a benefit of a wide FoV display.

Some embodiments of the present invention take advantage of the eye focus accommodation cue being mostly relevant at the center of the FoV, up to approximately 10 degrees from the FoV center, which is also where a human viewer's fovea lies. Away from the center of the human FoV stereoscopic display, some embodiments take advantage of the human vision poor ability to use eye focus accommodation. Apparently, outside the human fovea, spatial resolution is poorer, depth resolution decreases, and eye focus accommodation does not play a role, or plays less of a role, in human perception.

Some embodiments of the invention present an image type which provides more depth cues in one portion of a scene, such as a portion of the scene near a center of the FoV of a viewer, and another image or images of other types, which provide less depth cues, in other portions of the scene.

Some embodiments of the invention present an image type which provides more resolution in one portion of a scene, such as a portion of the scene near a center of the FoV of a viewer, and another image or images of other types, which provide less resolution, in other portions of the scene.

Some embodiments of the invention use a holographic display for displaying a greater number of depth cues, for example both eye focus accommodation and eye convergence, a stereoscopic display for providing an eye convergence cue, and a monoscopic display for providing even less depth cues.

In some embodiments, portions of an image which are close and center are optionally displayed with both eye focus accommodation and eye convergence, portions of an image which are farther from a viewer, or less near a center of the scene may optionally be displayed with an eye convergence cue of a stereoscopic image.

Depth perception by human eye focus accommodation is typically performed at distances between approximately 0.15 and 3 meters from a viewer, optionally between approximately 0.3 and 2 meters from the viewer. In some embodiments of the invention a holographic image at the center of a human field of view provides a depth cue of eye focus accommodation, while a surrounding, optionally stereoscopic, image is produced with focus at a plane approximately 2 meters away from the viewer.

In some embodiments the focus plane of the surrounding image is optionally adjusted or controlled by adjusting one or more optical components, such as a lens.

Because the eye resolution at a FoV outside of the fovea is poorer than within the FoV of the fovea, the depth of focus and depth resolution of the surrounding image is poorer. In some embodiments a surrounding image display optionally presents images, optionally at a focus plane of 0.15 to 3 meters, optionally using stereoscopic illusion. A combination of a Holographic image at a center of the FoV and surrounding image display potentially appears natural to a viewer.

In some embodiments a holographic image is displayed with a span taking up a field of view of 20 degrees, which is larger than a field of view of a human fovea. In some embodiments tracking a pupil and projecting a holographic image on a pupil is enough to enable at least a portion of the holographic image to be viewed by the fovea, and for the holographic image to appear to a human viewer at a portion of the field of view which provides sharpest acuity of vision.

In some embodiments, at an outer edge of the FoV, away from the fovea, even monoscopic display, providing no eye convergence is optionally displayed. Such a display potentially still appears natural to the viewer. By way of a non-limiting example, some of the scene is actually viewed by only one eye.

An aspect of the present invention includes displaying a portion of a scene with higher spatial resolution and/or depth cues near a center of a viewer's FoV, surrounded by one or more portions of the scene further away from the center of the viewer's FoV, optionally with lower resolution and/or providing less or no depth cues.

An aspect of the present invention includes displaying a holographic image near a center of a viewer's FoV, surrounded by and/or adjacent to a non-holographic image optionally further away from the center.

In some embodiments the non-holographic image is a stereoscopic image.

An aspect of the present invention includes displaying a higher resolution holographic image near a center of a viewer's FoV, surrounded by a lower resolution holographic image.

An aspect of the present invention includes displaying a holographic image near a center of a viewer's FoV, surrounded by and/or adjacent to a first image and surrounded still further, and/or adjacent to yet another second non-holographic image.

In some embodiments the central holographic image is a higher resolution holographic image and the first image is a lower resolution holographic image.

In some embodiments the first image is a stereoscopic image.

In some embodiments the second non-holographic image is a monoscopic image.

In some embodiments a combination between different parts of FoV is realized, where at a center of the FoV an image with optionally all depth cues is displayed, while at greater angles away from the center of the FoV only a stereoscopic image is presented, and at the edge of the FoV optionally only a monoscopic image is presented.

In some embodiments a holographic display is used to display and/or project at the center of the FoV, and a non-holographic imaging system such as a LCOS (Liquid Crystal on Silicon) or a LC (Liquid Crystal) display is combined to be viewed at a wider angle from the center of the FoV.

An aspect of the present invention relates to optionally tracking a viewer's pupil, and projecting the holographic display approximately to the center of the pupil. By maintaining the holographic display at the center of the FoV of the viewer, even when the eye changes direction, the image at surrounding portions of the FoV can be displayed at a lower resolution.

In some embodiments the lower resolution display potentially reduces complexity and/or computation time and or optical component quality needed for producing the surrounding image, potentially involving use of a lower-computation power and/or lower speed computation module for producing the surrounding image.

In some embodiments the lower resolution display includes an SLM with larger pixels. In some embodiments a holographic display is used to display and/or project to the fovea, and the surrounding display to project to some or all of the rest of the FoV.

In some embodiments a holographic display is used to display and/or project a holographic image to the fovea and to a surrounding area, to allow for small movements of the eye without the fovea viewing outside the central holographic scene.

In some embodiments, an angular span of the central holographic image is in a range between 2 degrees and 10 or 25 or even 45 degrees or more.

In some embodiments boundaries between the central holographic image and a surrounding image, and/or between the surrounding image and even more peripheral images, are displayed with an accuracy of a pixel. That is, the scene displayed in a surrounding image is a continuation of the more-central image at an accuracy of a pixel of the surrounding image. By way of a non-limiting example, lines which exist in the more-central image are continued in the surrounding, potentially lower resolution image, with an accuracy of a pixel.

In some embodiments boundaries between the central holographic image and a surrounding image, and/or between the surrounding image and even more peripheral images, are displayed with a sub-pixel accuracy. That is, the scene displayed in a surrounding image is a continuation of the more-central image at a sub-pixel accuracy of the surrounding image. By way of a non-limiting example, lines which exist in the more-central image are continued in the surrounding, potentially lower resolution image, with a sub-pixel accuracy.

In some embodiments boundaries between the central holographic image and a surrounding image, and/or between the surrounding image and even more peripheral images, are displayed so as not to be emphasized by a viewer's vision. In some embodiments at least a boundary portion of the surrounding image and/or the more central image is blurred, and or pixel values in at least the boundary portions are interpolated.

Before explaining at least one embodiment of the invention in detail, it is to be understood that the invention is not necessarily limited in its application to the details of construction and the arrangement of the components and/or methods set forth in the following description and/or illustrated in the drawings and/or the Examples. The invention is capable of other embodiments or of being practiced or carried out in various ways.

Reference is now made to FIG. 1A, which is a simplified illustration of a various portions of a Field of View of an eye relative to a center of the FoV, according to an example embodiment of the invention.

FIG. 1A shows an eye 101 with a direction of a center 105 of its FoV marked.

FIG. 1A depicts a first, inner section 108 of the FoV subtending a first angle 109 around the direction of the center 105 of the FoV, and a second, larger section of the FoV 110 subtending a second, larger angle, section 111 around the direction of the center 105 of the FoV.

In some embodiments the first, inner section 108 of the FoV optionally subtends an angle of approximately 10 degrees from the FoV center 105, which approximately corresponds to the FoV of a human viewer's fovea. In some embodiment the first, inner section 108 of the FoV optionally subtends an angle of approximately 1 degree, 2 degrees, 3 degrees, 5 degrees, 7 degrees, 9 degrees, 11 degrees, 13 degrees, 15 degrees, 17 degrees, 19 degrees, 21 degrees, 23 degrees, 25 degrees, 27 degrees, 29 degrees, 31 degrees and 33 degrees from the FoV center 105.

In some embodiments the second section 111 of the FoV optionally subtends an angle of approximately 60 to 110 degrees across, from side to side.

In some embodiments a central area of an image which is to display a CGH image is implemented as a circular area and/or as an oval area, optionally covering the area of the fovea or larger, while in some embodiments the central area of an image which is to display a CGH image is implemented as a square or a rectangular area, optionally covering the area of the fovea or larger.

In some embodiments a surrounding area of an image which is to display a lower resolution and/or a non-holographic image is implemented as a circular area and/or as an oval area surrounding the central area, while in some embodiments the surrounding area of the image which is to display the lower resolution and/or non-holographic image is implemented as a square or a rectangular area.

Figure 1B:
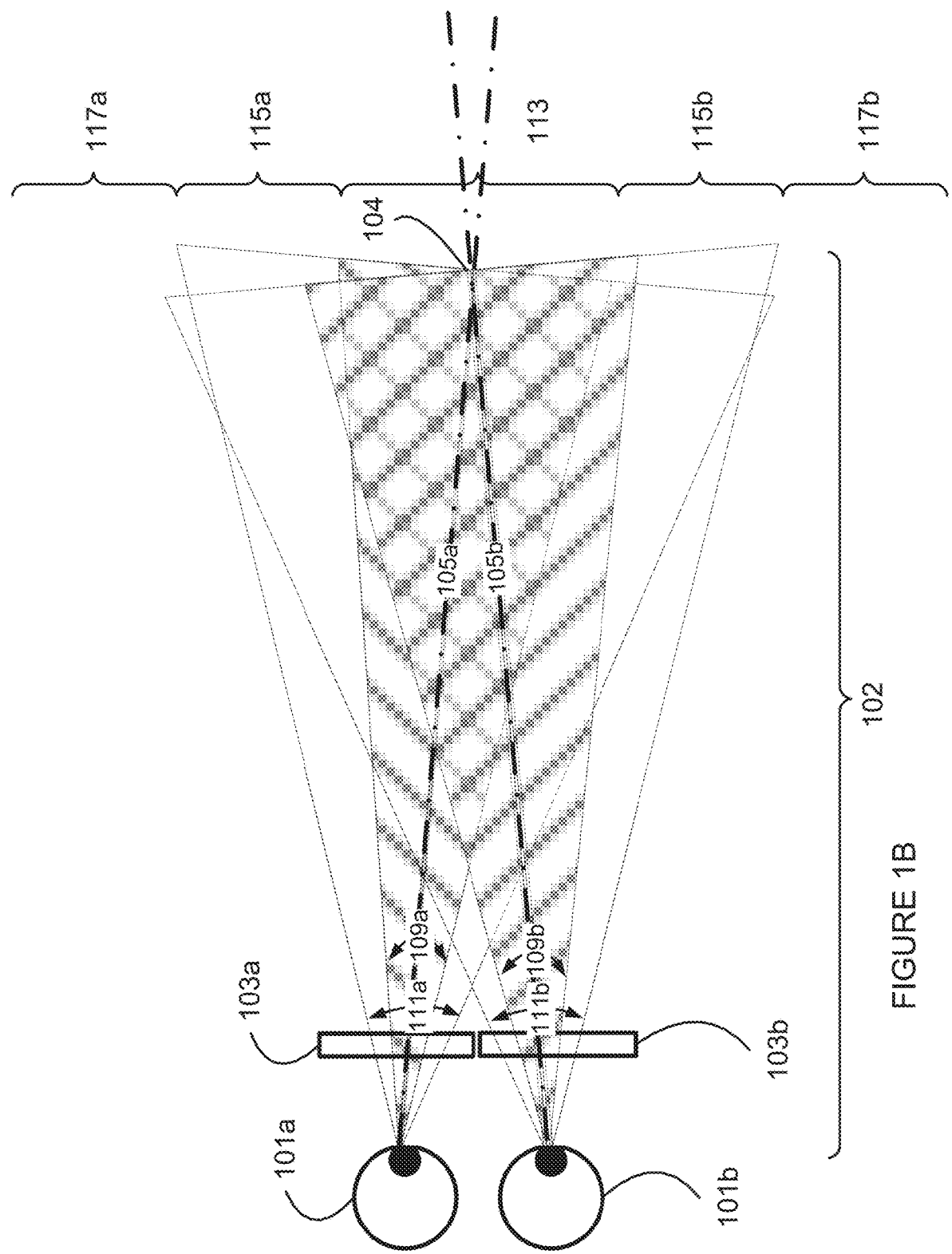
FIG. 1B is a simplified illustration of two eyes viewing a display, and various portions of their FoV relative to centers of their FoV, according to an example embodiment of the invention.

Reference is now made to FIG. 1B, which is a simplified illustration of two eyes 101a 101b viewing a display 103a 103b, and various portions of their FoV relative to centers 105a 105b of their FoV, according to an example embodiment of the invention.

FIG. 1B shows two eyes 101a 101b, each with a direction of a center 105a 105b of its FoV marked. FIG. 1B shows a non-limiting example embodiment where the two eyes' direction of the center 105a 105b of their FoV converge at a point 104 at a distance 102 from the eyes 101a 101b.

FIG. 1B depicts first, inner sections of the FoV depicted in FIG. 1A, subtending first angles 109a 109b around the direction of the centers 105a 105b of the FoV, and second, larger sections of the FoV subtending second, larger angles 111a 111b around the directions of the centers 105a 105b of the FoVs of the eyes 101a 101b.

FIG. 1B also shows displays 103a 103b in front of the eyes 101a 101b, which are designed to display an image or images to the eyes 101a 101b.

FIG. 1B illustrates various non-limiting example regions of a viewer's FoV: a first region 113 where both eyes 101a 101b see with the first inner sections of the FoV; second regions 115a 115b, where both eyes 101a 101b see with the second outer sections of the FoV; and third regions 117a 117b, where only one eye sees with the second outer section of the FoV and the other does not see.

In some embodiments the field of view of the two eyes 101a 101b viewing the first region 113 optionally subtends an angle of approximately 10 degrees side to side. In some embodiments the first region 113 optionally subtends an angle of approximately 2-66 degrees side to side.

In some embodiments a total field of view of the two eyes 101a 101b viewing the first, second and third regions 113 115a 115b 117a 117b optionally extends an angle of approximately 150-200 degrees across, from side to side.

In some embodiments the three regions 113 115(a,b) 117(a,b) exactly border each other, as shown in FIG. 1B, when the first inner sections of the FoV of both eyes exactly overlap and have a common outer border. When the first inner sections of the FoV of both eyes do not exactly overlap additional regions can be defined. A person skilled in the art, having studied the present document, will understand the additional regions and options for display to the regions. In some embodiments the three regions 113 115(a,b) 117(a,b) do not exactly border each other and additional regions (not shown) can be defined.

In some embodiments the regions 113 115a 115b 117a 117b of FIG. 1B correspond to regions suitable for displaying:

at the first region 113 a portion of a scene with optionally all depth cues, such as, for example, a holographic image;

at the second region 115a 115b a portion of an scene with less depth cues, such as, by way of a non-limiting example, a stereoscopic image, or a lower-resolution holographic image; and at the third region 117a 117b a portion of a scene with even less depth cues or resolution, such as, by way of a non-limiting example a monoscopic image.

It is noted that FIG. 1B shows example FoV regions and display schemes for corresponding scene portions, however, similar FoV regions and display schemes for corresponding scene portions may be implemented to a display for a single eye.

Reference is now made again to FIG. 1A. In some embodiments the regions 108 110 of FIG. 1A correspond to regions suitable for displaying:

at the first region 108 a portion of a scene with optionally all depth cues, such as, for example, a holographic image; and at the second region 110 a portion of a scene with less depth cues, such as, by way of a non-limiting example, a stereoscopic image, or a lower-resolution holographic image.

In some embodiments, a third region (not shown in FIG. 1A) lying around the second region 110 a portion of a scene with even less depth cues or resolution, such as, by way of a non-limiting example a monoscopic image, is displayed.

The following terms are hereby defined for use in the present application and claims:

a central portion of a Field of View of an eye;

an in-side of a more-peripheral portion of a Field of View of an eye, where inside refers to a nasal direction, or an inner side, between two eyes of a viewer; and an out-side of a more-peripheral portion of a Field of View of an eye, where outside refers to a temporal direction, opposite the nasal direction, or an outer side opposite a mid-point between the eyes.

Figure 1C:
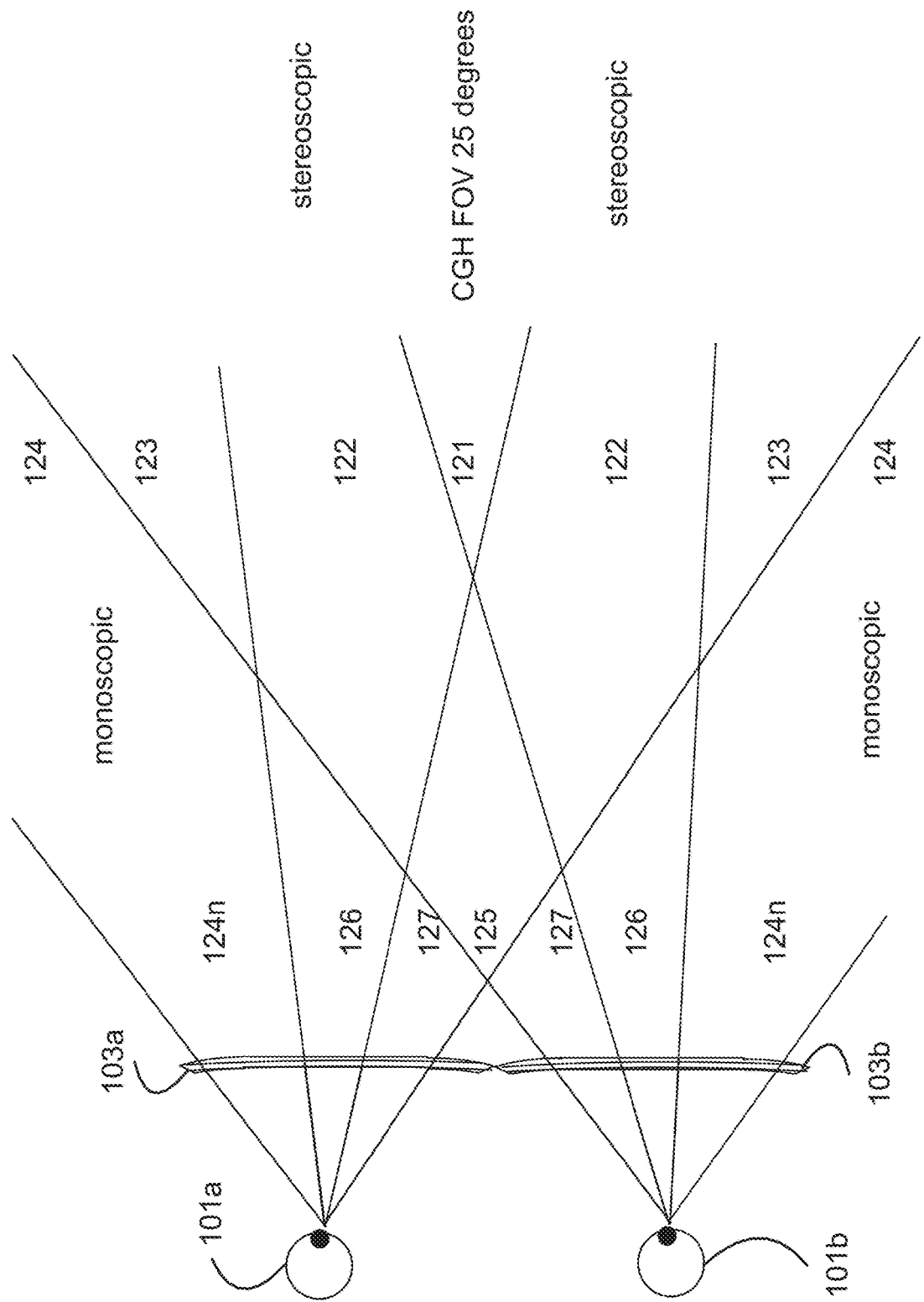
FIG. 1C is a simplified illustration of two eyes viewing a display, and various portions of their FoV according to an example embodiment of the invention.

Reference is now made to FIG. 1C, which is a simplified illustration of two eyes 101a 101b viewing a display 103a 103b, and various portions of their FoV according to an example embodiment of the invention.

FIG. 1C depicts:

a first region 121 where a central portion of the FoV of both of the eyes 101a 101b overlaps;

a second region 122 where a central portion of the FoV of a first one of the eyes 101a 101b overlaps an in-side more-peripheral portion of the FoV of a second one of the eyes 101a 101b;

a third region 123 where an out-side more-peripheral portion of the FoV of a first one of the eyes 101a 101b overlaps an in-side more-peripheral portion of the FoV of a second one of the eyes 101a 101b; and a fourth region 124 where an out-side more-peripheral portion of the FoV of a first one of the eyes 101a 101b does see, but the FoV of a second one of the eyes 101a 101b does not see.

The first region 121, the second region 122, the third region 123 and the fourth region 124 are depicted at a typical distance from the eyes 101a 101b and the displays 103a 103b where a scene is displayed.

FIG. 1C also depicts various portions of Fields of View of the eyes 101a 101b at a closer distance than the typical distance from the eyes 101a 101b and the displays 103a 103b than the first region 121, the second region 122, the third region 123 and the fourth region 124.

The closer portions of the FoV include, by way of some none-limiting examples: a fifth region 125 where an in-side more-peripheral portion of the FoV of a first one of the eyes 101a 101b overlaps an in-side more-peripheral portion of the FoV of a second one of the eyes 101a 101b;

a sixth region 126 where a central portion of the FoV of a first one of the eyes 101a 101b does see, but the FoV of a second one of the eyes 101a 101b does not see;

a seventh region 127 where an in-side more-peripheral portion of the FoV of a first one of the eyes 101a 101b does see, but the FoV of a second one of the eyes 101a 101b does not see; and an eighth region 124n where an out-side more-peripheral portion of the FoV of a first one of the eyes 101a 101b does see, but the FoV of a second one of the eyes 101a 101b does not see.

In some embodiments:
the first region 121 displays a CGH image;
the second region 122 displays a scene using a stereoscopic image, that is, an slightly shifted image of the scene displayed to each eye; and
the third region 123 and the fourth region 124 displays a scene using a monoscopic image.

In some embodiments the field of view of the two eyes 101a 101b viewing the first region 121 optionally subtends an angle of approximately 25 degrees side to side. In some embodiments the first region 121 optionally subtends an angle of approximately 2-66 degrees side to side.

In some embodiments a total field of view of the two eyes 101a 101b viewing the first, second, third and fourth regions 121 122 123 124 optionally extends an angle of approximately 150, 180, 200 and even 220 degrees and more across, from side to side.

Figure 2A:
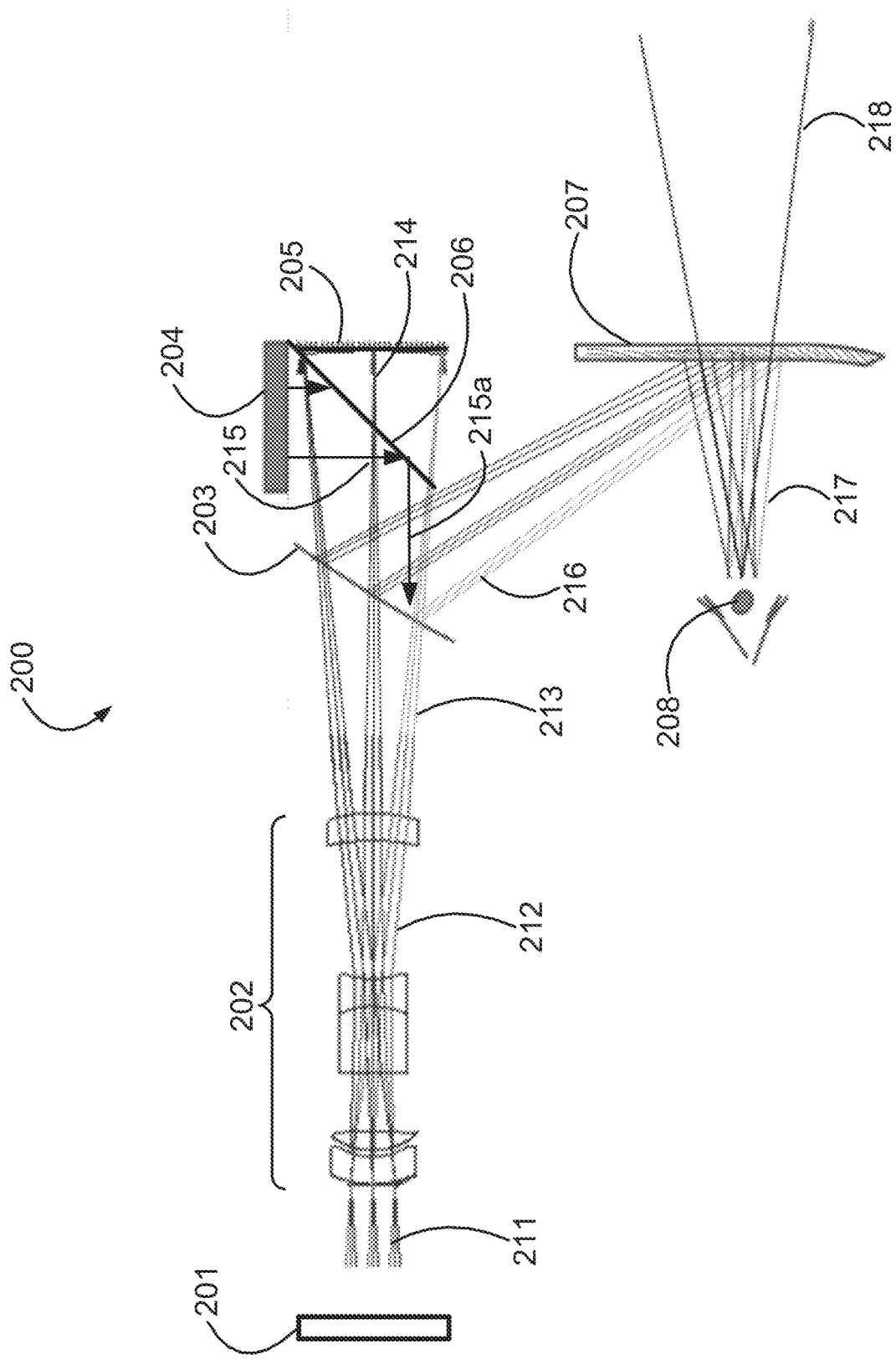
FIG. 2A is a simplified example of a display system for displaying a scene combining a central portion of the scene near a center of a FoV displayed as a holographic image from a holographic image display, surrounded by an additional portion of the scene displayed as an additional image from an additional display, according to an example embodiment of the invention.

Reference is now made to FIG. 2A, which is a simplified example of a display system 200 for displaying a scene combining a central portion of the scene near a center of a FoV displayed as a holographic image from a holographic image display, surrounded by an additional portion of the scene displayed as an additional image from an additional display, according to an example embodiment of the invention.

FIG. 2A shows one example embodiment for implementing the concept of a scene including a central holographic image surrounded by one or more additional images.

FIG. 2A shows components of the example embodiment: a Spatial Light Modulator (SLM) 201; optional optical components 202; a first semi-transparent mirror 203; an image display 204; a mirror 205; a second semi-transparent mirror 206; and a third semi-transparent mirror 207.

An example light path through the display system 200 is now described:

The SLM 201 projects light 211 (in some embodiments reflected light, in some embodiments light transferred through the SLM 201) modulated to produce a holographic image. The light 211 from the SLM may be at a single wavelength, that is one color, or more wavelengths, by way of a non-limiting example three colors. An example of producing a holographic image using three colors is described in above-mentioned U.S. Provisional Patent Application No. 62/298,070.

The light 211 optionally passes through the optional optical components 202, as light 212, emerging as light 213 for producing a holographic image.

The light 213 passes through the first semi-transparent mirror 203 and through the second semi-transparent mirror 206, emerging as light 214 for producing a holographic image.

The light 214 for producing a holographic image is reflected back from the mirror 205, through the second semi-transparent mirror 206 and onto the first semi-transparent mirror 203.

Additional light 215 from the image display 204 is projected toward the second semi-transparent mirror 206, and is reflected 215a from the second semi-transparent mirror 206 onto the first semi-transparent mirror 203. The additional light 215a from the image display 204 and the light 214 for producing a holographic image are now traveling toward a same direction and through the same optical components.

Light 216, which is a combination of the additional light 215a from the image display 204 and the light 214, is reflected from the first semi-transparent mirror 203 toward the third semi-transparent mirror 207. The light is then reflected from the third semi-transparent mirror 207 as light 217 to the viewer's eye 208. The viewer's eye 208 sees a scene which is a combination of a CGH image produced by the SLM and an additional image produced by the image display 204, the scene appearing to be in a direction 218 in front of the viewer's eye 208.

In some embodiments the viewer's eye 208 can view a scene which is a combination of a CGH image produced by the SLM, an additional image produced by the image display 204, and a view of the real world through the third semi-transparent mirror 207, the scene appearing to be in a direction 218 in front of the viewer's eye 208.

In some embodiments, the image display 204 projects light, for example the image display 204 may be, by way of a non-limiting example, an LCD display with LED lights transmitting through the LCD display.

In some embodiments, illumination for the image display 204 may be projected along and optionally through the same components as the light projected from the SLM 211, and eventually be reflected off the second semi-transparent mirror 206 onto the image display 204, which reflects the light as the additional light 215.

In some embodiments the image display 204 reflects or projects an image only in portions of a scene in which the CGH does not appear.

In some embodiments such limiting of an image displayed by the image display 204 is optionally done by switching off pixels which would appear at the portion of the scene where the CGH image appears.

In some embodiments the light illuminating the image display 204 is optionally the same light source producing the CGH image, or from a light source adjacent to the light source producing the CGH image, which may also optionally additionally pass through a diffuser, to reduce potential speckles due to interference if coherent light was used without a diffuser.

In some embodiments the first semi-transparent mirror 203 is a semi-transparent mirror.

In some embodiments the third semi-transparent mirror 207 is a volume holographic optical element, optionally at a wavelength specific to the one or two or three or more illumination wavelength(s) used for displaying the scene.

In some embodiments the field of view of the eye 208 for viewing the CGH image optionally subtends an angle of approximately 25 degrees side to side. In some embodiments the field of view of the eye 208 for viewing the CGH image optionally subtends an angle of approximately 2-66 degrees side to side.

In some embodiments a total field of view of the eye 208 optionally extends an angle of approximately 90 to 150 degrees and more across, from side to side.

It is noted that while the above description of FIG. 2A was provided with reference to the viewer's left eye, a similar and mirror image applies to the viewer's right eye, and a display for the right eye FoV regions is also taught, as can easily be understood by a person of ordinary skill in the art.

In some embodiments a total field of view of two eyes combined optionally subtends an angle of approximately 90 to 220 degrees and more across, from side to side.

In some embodiments the image display 204 of FIG. 2A is placed on sides, optionally horizontal sides, or both horizontal and vertical sides, of the SLM 201, and the light from the image display 204 proceeds through the same optical path as the light from the SLM 201.

In some embodiments the image display 204 of FIG. 2A is placed on sides, optionally horizontal sides, or both horizontal and vertical sides, of the CGH display rays to form FoV separation as depicted in FIG. 1C.

FIG. 2A has described above, and FIG. 5 will describe below, some non-limiting examples of how to combine a holographic image and a non-holographic image.

Reference is now made to FIGS. 2B-2F, which are simplified line drawing illustrations of producing a scene according to an example embodiment of the invention.

Figure 2B:
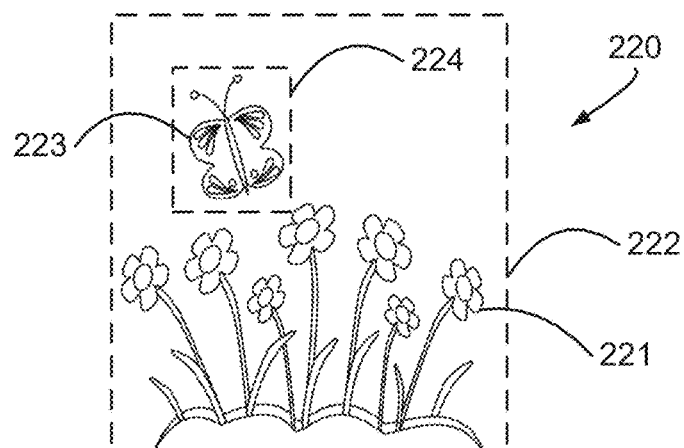
FIGS. 2B-2F are simplified line drawing illustrations of producing a scene according to an example embodiment of the invention.

FIG. 2B illustrates an example embodiments of a scene 220 for display in a hybrid holographic display constructed according to an example embodiment, where a first portion 224 of the scene 220 is optionally displayed as a holographic image, and a second portion 222 of the scene is optionally displayed as an adjacent or surrounding non-holographic image. In the example of FIG. 2B the first portion 224 shows a butterfly 223 at such a distance where eye focus accommodation may be perceived by a viewer, and the butterfly 223 of the first portion 334 is displayed as a holographic image. In the example of FIG. 2B the second portion 222 shows a background such as a field of flowers 221 at such a distance where eye focus accommodation may not be perceived by a viewer, and the field of flowers 221 of the second portion 222 is optionally displayed as a non-holographic image, for example a stereoscopic image.

In some embodiments the portions 222 224 may be rectangular, as shown in FIG. 2B. in some embodiments the portions 222 224 includes just a shape of an object, for example the first portion 224 may include just the shape of the butterfly 223 and the second portion 222 may include just the shape of the field of flowers 221.

Figure 2C:
Figure 2D:
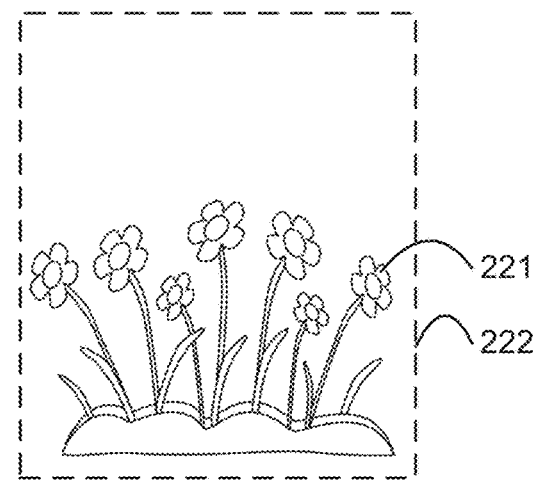

FIG. 2C shows an example of the first portion 224 which the SLM 201 of FIG. 2A may be used to display, which FIG. 2D shows an example of the second portion 222 which the image display 204 may be used to display, resulting in a combined hybrid holographic and stereoscopic image.

In some embodiments the SLM 201 of FIG. 2A may be used to provide, in addition to the first portion 224 which includes the butterfly 223, a dark background for a stereoscopic view of the field of flowers 221.

Figure 2E:
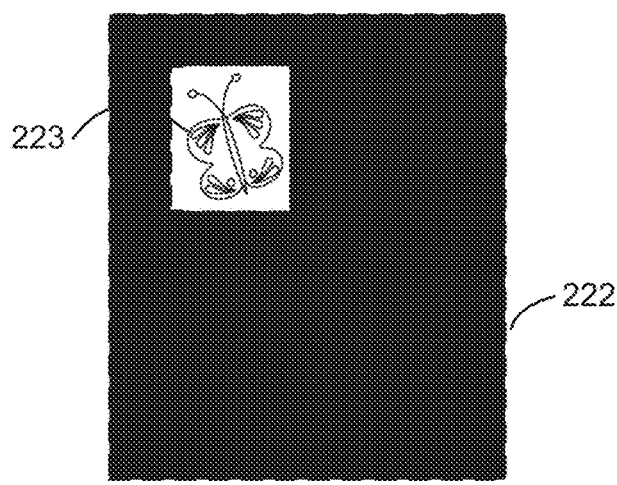

FIG. 2E shows an example of the first portion 224 which the SLM 201 of FIG. 2A may be used to display, including a dark area to serve as a dark background for combining with the second portion 222.

In some embodiments the image display 204 may be used to provide, in addition to the second portion 222 which includes the field of flowers 221, a dark background for a holographic image of the butterfly 223.

Figure 2F:
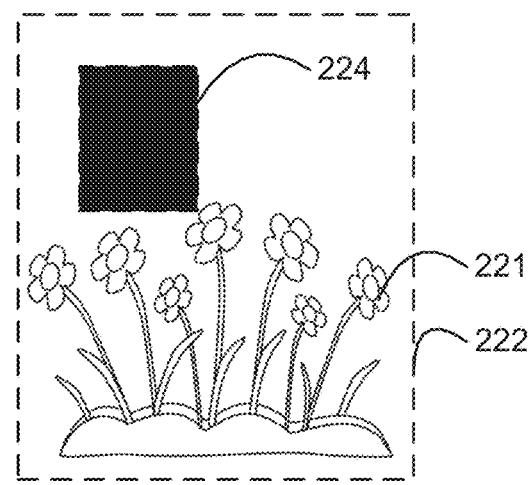

FIG. 2F shows an example of the second portion 222 which the image display 204 of FIG. 2A may be used to display, including a dark area to serve as a dark background for combining with the first portion 224.

Figure 3A:
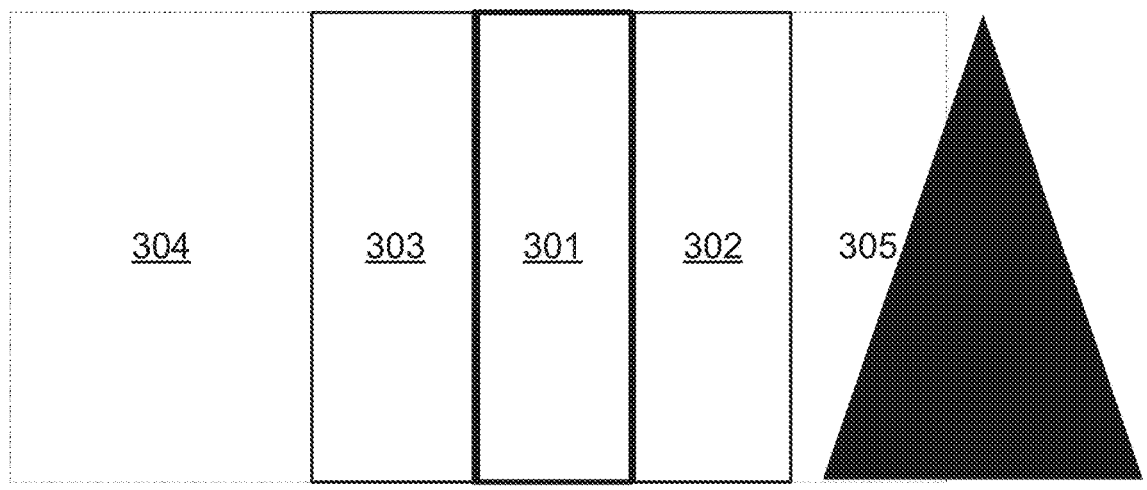
FIG. 3A is a simplified illustration of portions of Fields of View of a viewer's left eye, according to an example embodiment of the invention.

Reference is now made to FIG. 3A, which is a simplified illustration of portions of Fields of View of a viewer's left eye, according to an example embodiment of the invention.

FIG. 3A depicts a non-limiting example of portions of FoV as seen from a left eye and from the viewer's perspective.

FIG. 3A depicts:
a first, inner region 301 of the FoV of the viewer's left eye;
a second, in-side more-peripheral region 302 of the FoV of the viewer's left eye, toward a viewer's nose 307 side; and
a third, out-side more-peripheral region 303 of the FoV of the viewer's left eye, away from the nose 307 side.

Optionally, in some embodiments, even-more-peripheral regions are used:
a fourth, out-side even-more-peripheral region 304 of the FoV of the viewer's left eye away from the nose 307 side; and
a fifth, in-side even-more-peripheral region 305 of the FoV of the viewer's left eye toward a viewer's nose 307 side.

In some embodiments a display for the viewer's left eye may display a scene in which the different FoV portions 301 302 303 (and optionally 304 305) may optionally display the scene using different techniques, such as holographic and/or stereoscopic and/or monoscopic, and/or optionally using different resolutions of display at the different FoV portions 301 302 303 (and optionally 304 305).

It is noted that while the above description was provided with reference to the viewer's left eye, a similar and mirror image applies to the viewer's right eye, and a display for the right eye FoV regions is also taught, as can easily be understood by a person of ordinary skill in the art.

In some embodiments the widths of the regions 301 302 303 304 305 is not necessarily the same, and as many as all of the regions may be of different widths.

In some embodiments the width of the first region 301 corresponds to the viewer's foveal vision region.

The human foveal region spans approximately 5 degrees. In some embodiments the width of the first region 301 is made to span more than the human foveal region, which provides a potential advantage that there is less need or urgency for tracking the human pupil and keeping the first region 301 on the viewer's fovea.

In some embodiments the angle spanned by the first region 301 is approximately 5 degrees, 10 degrees, 15 degrees, 20 degrees, 25 degrees, and even more.

Figure 3B:
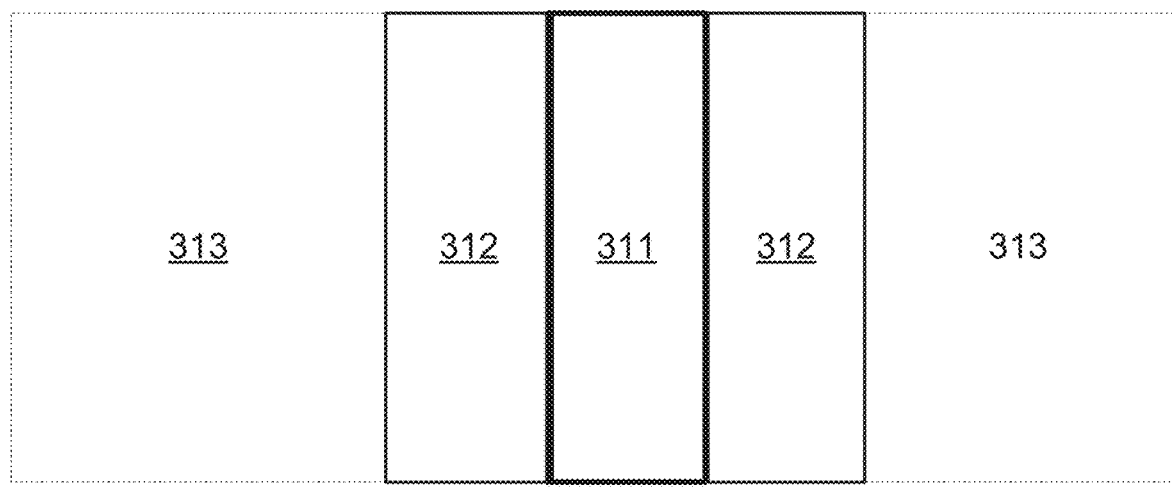
FIG. 3B is a simplified illustration of portions of Fields of View of a viewer's combined left and right eye vision, according to an example embodiment of the invention.

Reference is now made to FIG. 3B, which is a simplified illustration of portions of Fields of View of a viewer's combined left and right eye vision, according to an example embodiment of the invention.

FIG. 3B depicts a non-limiting example of portions of FoV as seen with two eyes from the viewer's perspective.

FIG. 3B depicts a first, inner region 311 of the viewer's FoV using combined vision with two eyes, typically with both eyes looking toward a same location and a second, more-peripheral region 312 of the viewer's FoV.

FIG. 3B also depicts a third, even-more-peripheral region 313 of the viewer's FoV.

In some embodiments a display for the viewer's combined vision displays a scene in which the different FoV portions 311 312 (and optionally 313) may optionally display the scene using different techniques, such as holographic and/or stereoscopic and/or monoscopic, and/or optionally using different resolutions of display at the different FoV portions 311 312 (and optionally 313).

Figure 3C:
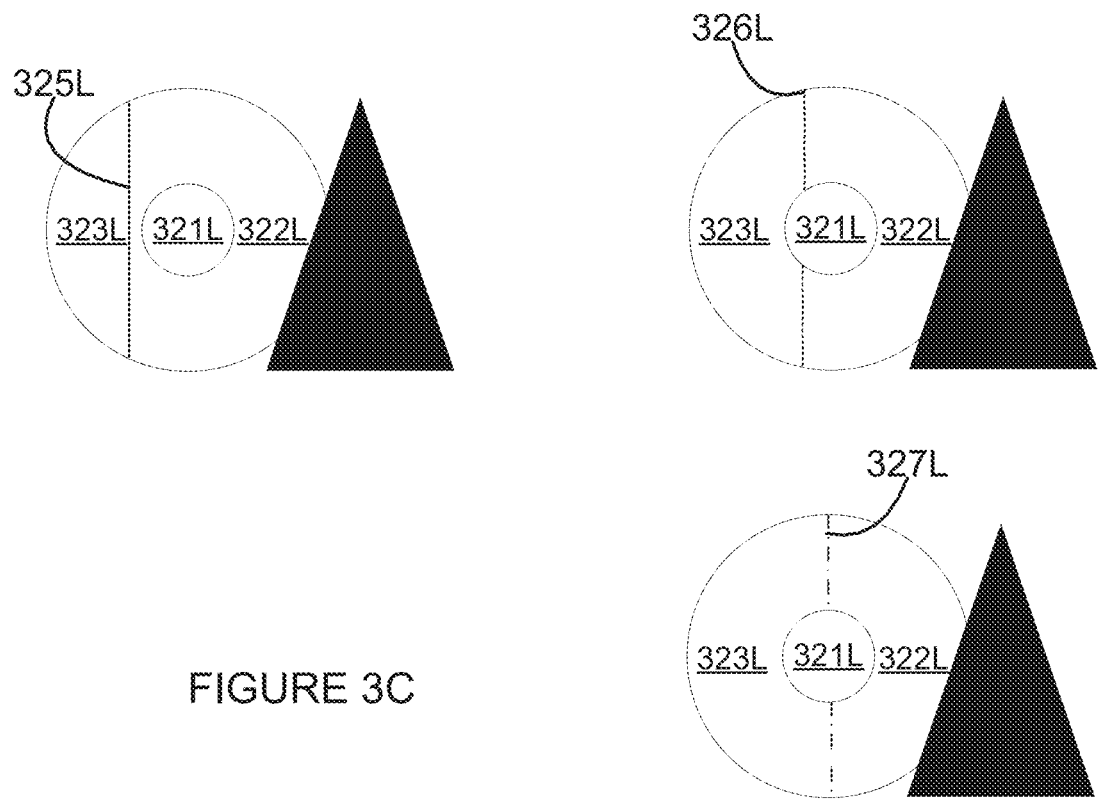
FIG. 3C is a simplified illustration of portions of a Field of View of a viewer's left eye, according to an example embodiment of the invention.

Reference is now made to FIG. 3C, which is a simplified illustration of portions of a Field of View of a viewer's left eye, according to an example embodiment of the invention.

FIG. 3C depicts a non-limiting example of portions of FoV as seen from a viewer's perspective.

FIG. 3C depicts:

a first, inner region 321L of the FoV of the viewer's left eye;

a second, in-side more-peripheral region 322L of the FoV of the viewer's left eye; and a third, out-side more-peripheral region 323L of the FoV of the viewer's left eye.

FIG. 3C also depicts border lines 325L 326L 327L between the in-side and the out-side more-peripheral regions of the FoV of the left eye.

In some example embodiments the border line may pass in the middle of the left eye's FoV, such as the border line 327L. In some example embodiments the border line may pass further out from the middle of the left eye's FoV, such as the border line 326L. In some example embodiments the border line may pass even further out from the middle of the left eye's FoV, such as the border line 325L.

In some embodiments the area spanned by the first, inner region 321L of the FoV of the viewer's left eye corresponds to the viewer's left eye foveal vision region.

In some embodiments the angle spanned by the first, inner region 321L of the FoV of the viewer's left eye is in a range of approximately 5 to 25, 30, or 35 degrees or more.

In some example embodiments still-more-peripheral regions may be defined (not shown in FIG. 3C), and in some example embodiments the still-more-peripheral regions of the FoV may be divided by border lines into in-side and out-side still-more-peripheral regions of the FoV.

It is noted that while the above description was provided with reference to the viewer's left eye, a similar and mirror image applies to the viewer's right eye, and a display for the right eye FoV regions is also taught, as can easily be understood by a person of ordinary skill in the art.

Reference is again made to FIG. 2A. As described above, in some embodiments, illumination for the image display 204 may be projected along and optionally through the same components as the light projected from the SLM 211, and eventually be reflected off the second semi-transparent mirror 206 onto the image display 204, which reflects the light as the additional light 215.

Figure 4:
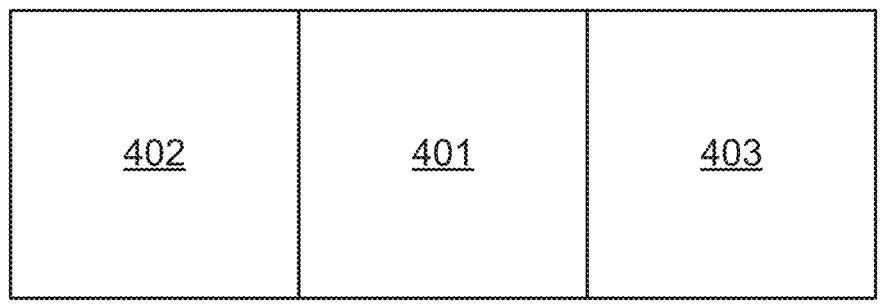
FIG. 4 is a simplified line drawing illustration of illumination fields or regions for the SLM of FIG. 2A and the image display of FIG. 2A, according to an example embodiment of the invention.

Reference is now made to FIG. 4, which is a simplified line drawing illustration of illumination fields or regions for the SLM of FIG. 2A and the image display of FIG. 2A, according to an example embodiment of the invention.

FIG. 4 shows a first, central illumination region 401 for the SLM (reference 201 of FIG. 2A) illumination, a second illumination region 402 for a left region of the image display 204 of FIG. 2A, and a third illumination region 403 for a right region of the image display 204 of FIG. 2A.

It is noted that while the above descriptions of FIGS. 3A-3C and 4 were provided with reference to the viewer's left eye, a similar and mirror image description applies to the viewer's right eye, and a display for the right eye FoV regions as well as two display for displaying to both eyes are also taught, as can easily be understood by a person of ordinary skill in the art.

It is noted that while the above descriptions of FIGS. 3A-3C and 4 were provided with reference to segmenting a field of view into segments along a horizontal direction, the field of view may be segmented along the vertical direction, also into a central higher-resolution segment and one or more surrounding lower resolution segment(s) as can be understood by a person of ordinary skill in the art.

FIG. 2A described an example embodiment of a system for displaying a scene combining a central portion of the scene near a center of a FoV displayed as a holographic image from a holographic image display, surrounded by an additional portion of the scene displayed as an additional image from an additional display.

An additional example embodiment of such a system is now described. Even more implementations may be understood by persons skilled in the art, based on the example embodiments taught herein.

Figure 5:
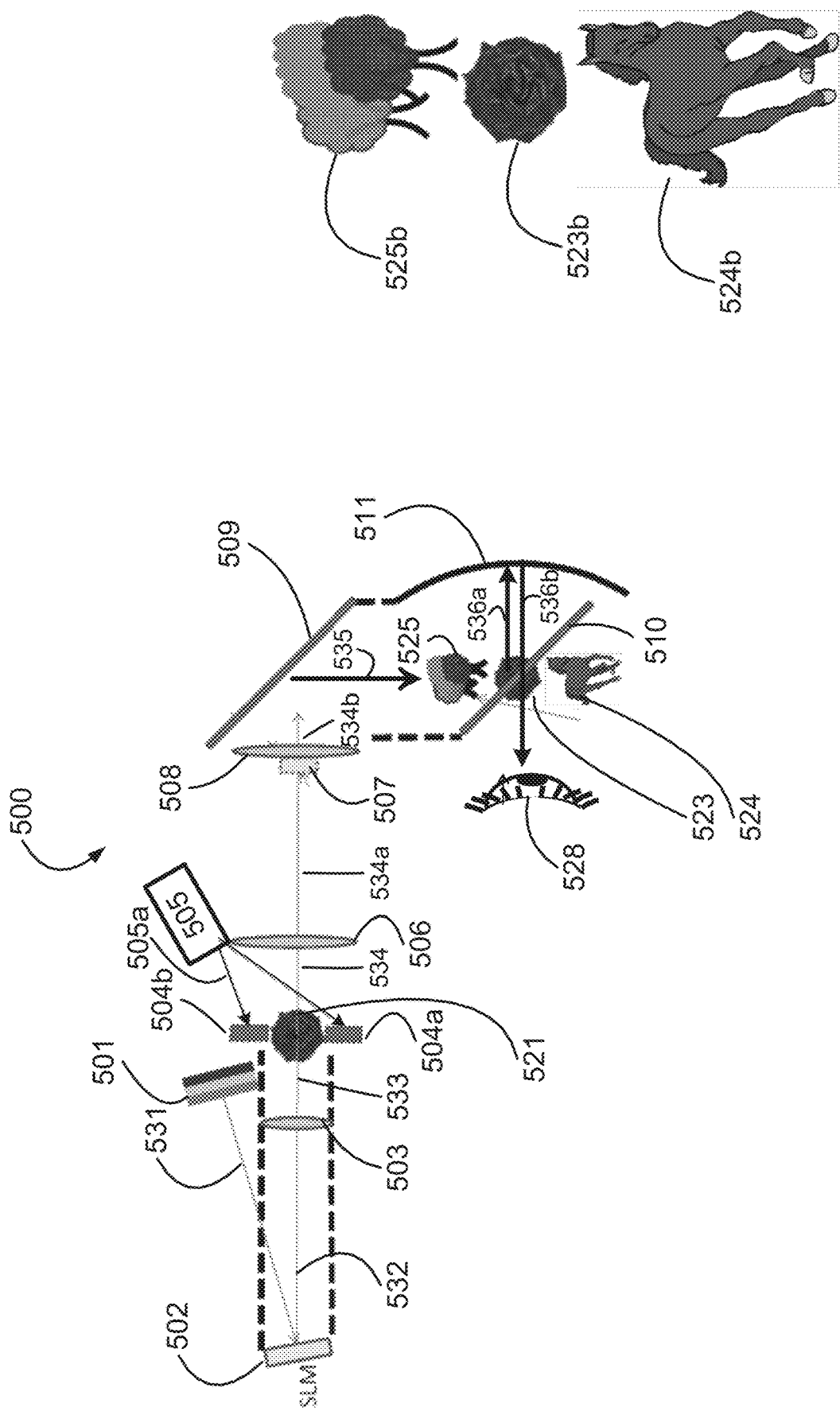
FIG. 5 is a simplified example of a display system for displaying a scene combining a central portion of the scene near a center of a FoV displayed as a holographic image from a holographic image display, surrounded by an additional portion of the scene displayed as an additional image from an additional display, according to an example embodiment of the invention.

Reference is now made to FIG. 5, which is a simplified example of a display system 500 for displaying a scene combining a central portion of the scene near a center of a FoV displayed as a holographic image from a holographic image display, surrounded by an additional portion of the scene displayed as an additional image from an additional display, according to an example embodiment of the invention.

FIG. 5 shows an example embodiment for implementing the concept of a scene including a central holographic image surrounded by one or more additional images.

FIG. 5 shows components of the example embodiment: a coherent light illuminator 501 (one or more wavelengths); a Spatial Light Modulator (SLM) 502; one or more first optional optical component(s) 503; an image display 504a 504b; an optional illuminator 505; one or more second optional optical component(s) 506; one or more third optional optical component(s) 508; a first mirror 509; a second semi-transparent/semi-reflective mirror 510; and a third mirror 511.

In some embodiments the image display(s) 504a 504b may be a flat display projecting images, such as, by way of a non-limiting example, a LED display or a LCOS display. In some embodiments the image display(s) 504a 504b may be a flat display with a hole in the middle for allowing the modulated light from the SLM 502 to pass through. In some embodiments the image display(s) 504a 504b may be two or more flat displays with a space between the image display(s) 504a 504b for allowing the modulated light from the SLM 502 to pass through.

In some embodiments an optional aperture stop is optionally placed in a location referenced by the reference number 507 in the optical path.

In some embodiments optical components are designed so that an image of the SLM 502 is produced in the location referenced by the reference number 507 in the optical path.

An example light path through the display system 500 is now described:

The coherent light illuminator 501 projects coherent light 531 (at one wavelength or at or two or three or more wavelengths at different times), which is modulated by the SLM 502 to produce a holographic image. Modulated light 532 from the SLM 502 may be at a single wavelength, that is one color, or at more wavelengths at different time slots, synchronized with values of the SLM pixels. An example of producing a holographic image using three colors is described in above-mentioned U.S. Provisional Patent Application No. 62/298,070.

The modulated light 532 optionally passes through the optional optical component(s) 503, emerging as modulated light 533 for producing a first holographic image 521.

The first holographic image 521 is optionally produced in a location along the optical path which is approximately at the location of the image display 504a 504b. In FIG. 5 the holographic image 521 is a three-dimensional holographic image of a rose.

In some embodiments the image display(s) 504a 504b produces light travelling toward the first mirror 509.

In some embodiments the optional illuminator 505 optionally illuminates 505a the image display(s) 504a 504b, which reflect light toward the first mirror 509.

The modulated light from the SLM also travels toward the first mirror 509. The combined light is marked as light 534.

The light 534 optionally passes through the one or more second optional optical component(s) 506 emerging as light 534a and through the one or more third optional optical component(s) 508 emerging as light 534b.

The light 534b continues toward the first mirror 509, and reflects as light 535 off the first mirror 509 toward the second semi-transparent/semi-reflective mirror 510.

In some embodiments the light 535 produces images approximately at the location of the second semi-transparent/semi-reflective mirror 510. FIG. 5 shows, by way of a non-limiting example, a second holographic image of a rose 523, reimaged by reflections 536a 536b from the first holographic image of the rose 521, an additional image of a horse 524, and an additional image of trees 525.

The images 523 524 525 reflect 536a off the second semi-transparent/semi-reflective mirror 510 toward the third semi-transparent/semi-reflective mirror 511, and reflect 536b off the third mirror 511 toward a viewer's eye 528.

In some embodiments the viewer's eye 528 can view a scene which is a combination of a CGH image produced by the SLM, an additional image produced by the image display(s) 504a 504b, and a view of the real world through the third mirror 511, which is optionally a semi-transparent mirror 511, the scene appearing to be in a direction in front of the viewer's eye 528.

In some embodiments the mirror 511 is optionally a magnifying mirror, and the viewer optionally sees the images 523 524 525 as larger and more distant images 523b 524b 525b.

In some embodiments the CGH image is at different location along the optical path than display 504a, and 504b, which potentially shifts a focus distance of the surrounding images 524 525 524 b 525b relative to the focus distance of the CGH image 523 523b.

It is noted that while the above description of FIG. 5 was provided with reference to one of the viewer's eyes, a similar image applies to the viewer's other eye, and a display for the other eye FoV regions is also taught, as can easily be understood by a person of ordinary skill in the art. In some embodiments the display system 500 of FIG. 5 is replicated for a viewer's other eye, and the viewer benefits from seeing the scene of images 523 524 525 or magnified images 523b 524b 525b with both eyes.

In some embodiments the third mirror 511 is fully reflective, and the viewer sees what is termed a "virtual reality" scene.

In some embodiments the third mirror 511 is semi-reflective/semi-transparent, and the viewer also sees, through the third mirror 511, the real world, combined with the scene the scene of images 523 524 525 or magnified images 523b 524b 525b. Such a combination of the real world and a displayed image is termed "augmented reality".

In some embodiments the mirror 511 only reflects the illuminating wavelength while it is transparent to other wavelengths.

In some embodiments the first mirror 509 is optionally semi-transparent/semi-reflective, and optional pupil tracking components (not shown, but described in above-mentioned U.S. Provisional Patent Application No. 62/298,070) may be included behind the first mirror 509, optionally tracking the viewer's pupil off the intervening optical components, potentially providing pupil tracking data to a computer controlling the SLM 502 and the image display(s) 504a 504b, thereby optionally controlling production of the scene.

FIG. 5 shows a configuration of one side, or one eye, of a potential Head Mounted Display (HMD) where the image display(s) 504a 504b are adjacent to a holographic image 521. In some embodiments the location of the holographic image 521 may optionally also be a location of a zero-order diffraction bright spot blocker.

In some embodiments a tilting mirror, such as the mirror 510, optionally directs an observing window to the eye 528 even when the viewer shifts the eye 528 to look to a different direction. The entire displayed image including the CGH and the stereoscopic FoV are tilted by the tilting mirror.

In some embodiments the mirror 509 is optionally used to stabilize the images 523 524 525 523b 524b 525b against head movements.

In some embodiments the mirror 509 is optionally used to maintain the CGH image in the FoV of the fovea even if the viewer moves his/her eyes away from a central axis direction.

In some embodiments an additional SLM tilting mirror (not shown) is optionally added to stabilize the images 523 524 525 523b 524b 525b against head movements. The SLM tilting mirror is optionally imaged to a pupil of the observer's eye 528. When the SLM tilting mirror is tilted the images 523 524 525 523b 524b 525b shift to different parts of the eye 528 FoV. Such tilting is optionally used to stabilize the displayed scene in the FoV, including both the holographic image and the additional, optionally stereoscopic regions of the FoV.

In some embodiments the SLM mirror is optionally used to expand a time average FoV by fast tilting and instantaneously projecting parts of the scene to increase FoV at a cost of a time-averaged intensity.

Additional Aspects

In some embodiments in order to camouflage a border between a central holographic image in a scene and a surrounding additional image, the holographic image and the surrounding image are optionally produced at similar levels of image brightness.

In some embodiments, the image brightness is controlled by controlling an intensity of light illuminating the SLM and illuminating the additional image display. In some embodiments, the image brightness is controlled by illuminating both the SLM for producing the holographic image and the additional display for producing the additional image with the same coherent illumination. In some embodiments, because of the coherent illumination, interference speckles may appear which may reduce image quality of the scene.

In some embodiments, to reduce or eliminate interference speckles, an optical path length difference between the CGH image and the surrounding (optionally stereoscopic) image is produced, typically longer than a coherence length of the coherent illumination. Such an optical path length difference reduces or eliminates fringes or speckles at the boundary between the two images.

In some embodiments the optical path difference is produced by placing the image display(s) 504a at a different location along the optical path than the location of the first holographic image 521. The different locations are preferably different by a distance greater than a coherence distance of the coherent illumination.

In some embodiments the optical path difference is produced by separating the illumination of the image display(s) 504a from the illumination of the SLM 502, and causing one of the illumination paths of the coherent illumination to be different from the other by a distance greater than a coherence distance of the coherent illumination.

In some embodiments, two coherent light sources are used for illuminating the SLM and the additional display. Such embodiments also reduce or eliminate potential interference, since a coherence time of each of the coherent light sources, for example lasers, is typically at a nanosecond scale.

In some embodiments, a diffuser is placed in the optical path that smears the speckles, optionally at a frequency greater than 20 Hz which is a typical time of response of a human eye.

Figure 6:
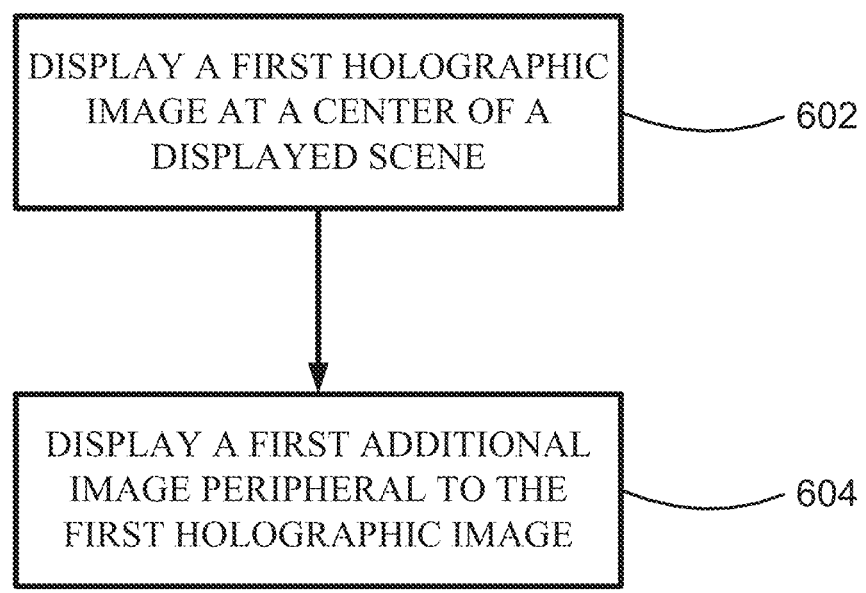
FIG. 6 is a simplified flow chart illustration of a method for displaying a wide Field of View (FoV) scene including a holographic image within the scene.

Reference is now made to FIG. 6, which is a simplified flow chart illustration of a method for displaying a wide Field of View (FoV) scene including a holographic image within the scene.

The method of FIG. 6 includes:
displaying a first holographic image at a center of a displayed scene (602); and
displaying a first additional image peripheral to the first holographic image (604).

In some embodiments a viewer's pupil is tracked, and an optical system for displaying the first holographic image is controlled to display the first holographic image to the viewer's pupil.

In some embodiments the first additional image is a lower spatial resolution display than the first holographic image.

In some embodiments the first additional image is a stereoscopic image.

In some embodiments the first additional image is a second holographic image. The second holographic image may optionally be at a lower resolution than the first holographic image, and may optionally be displayed to an area of the viewer's eye which sees at a lower resolution, by way of some non-limiting examples away from the center of the viewer's FoV, and/or peripheral to the center of the viewer's FoV, and/or surrounding the first holographic image.

In some embodiments a second additional image is displayed, optionally adjacent to and/or peripheral and/or surrounding the first additional image.

In some embodiments the second additional image is a stereoscopic image.

In some embodiments the first holographic image and the additional image(s) are displayed by a Head Mounted Display (HMD).

In some embodiments the displaying a first holographic image and the additional image(s) includes displaying two first holographic images each one at a center of a displayed scene to each one of two eyes and displaying two additional images, or two sets of additional images to each one of the two eyes.

Figure 7:
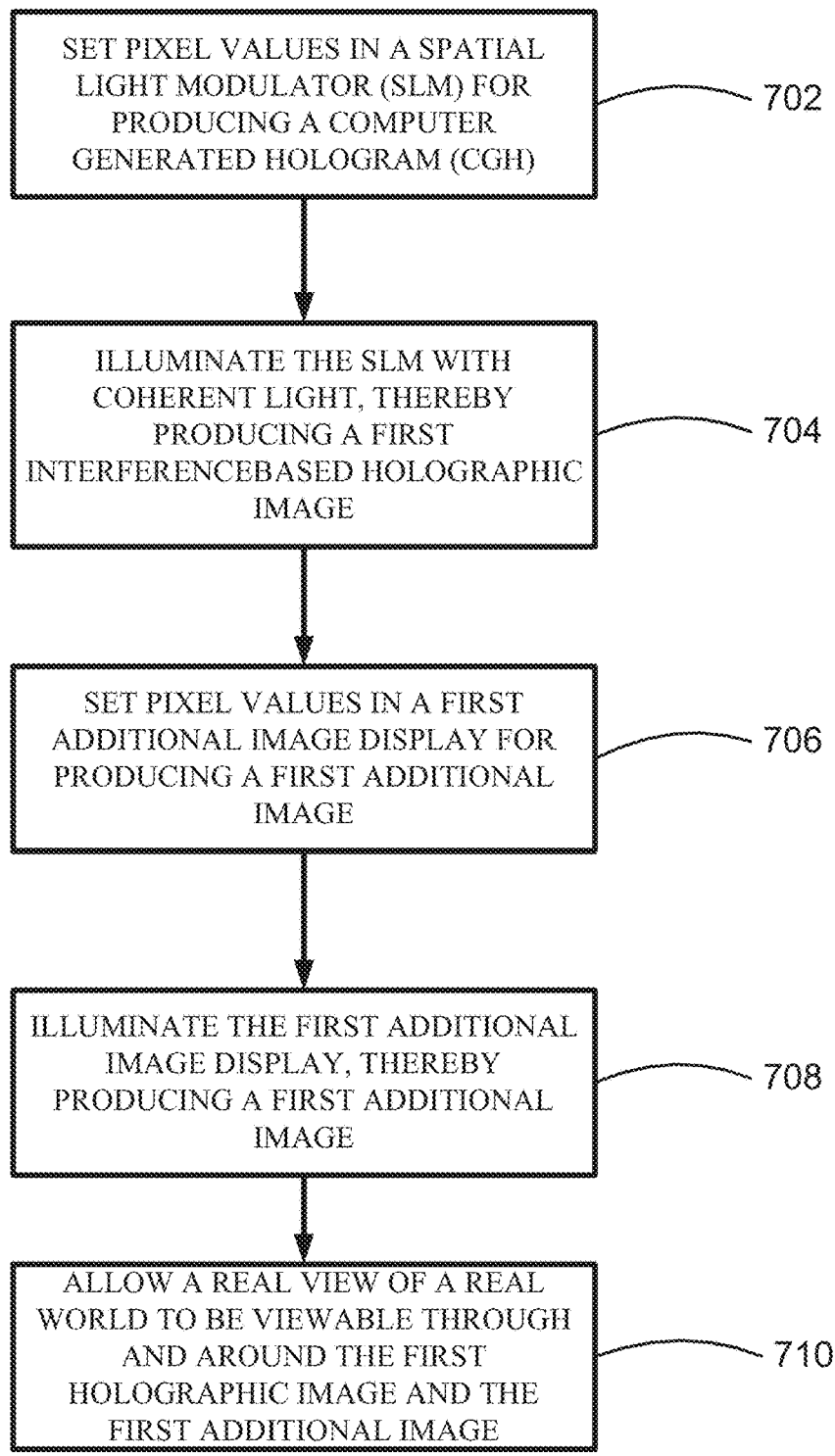
FIG. 7 is a simplified flow chart illustration of a method for displaying a wide Field of View (FoV) scene including an interference based holographic image within the scene, according to an example embodiment of the invention.

Reference is now made to FIG. 7, which is a simplified flow chart illustration of a method for displaying a wide Field of View (FoV) scene including an interference based holographic image within the scene, according to an example embodiment of the invention.

The method of FIG. 7 includes:
setting pixel values in a Spatial Light Modulator (SLM) for producing a Computer Generated Hologram (CGH) (702);
illuminating the SLM with coherent light, thereby producing a first interference based holographic image (704);
setting pixel values in a first additional image display for producing a first additional image (706);
illuminating the first additional image display, thereby producing a first additional image (708); and
allowing a real view of a real world to be viewable through and around the first holographic image and the first additional image (710),
wherein
the first holographic image is projected toward a viewer's fovea;
the first additional image is displayed as part of the scene and adjacent to the first holographic image; and
the real view of a real world is also viewable as part of the scene.

In some embodiments, the first holographic image is displayed at a center of a scene; and the first additional image is displayed as part of the scene and adjacent to the first holographic image.

In some embodiments, a viewer's pupil is tracked and the displaying the first holographic image is controlled to display the first holographic image to the viewer's pupil.

In some embodiments the displaying the first holographic image and the second additional image is performed by a Head Mounted Display (HMD).

In some embodiments, the displaying the first holographic image includes displaying two first holographic images, each one at a center of a displayed scene to each one of two eyes, and the displaying the second additional image includes displaying two first additional images to each one of the two eyes.

It is expected that during the life of a patent maturing from this application many relevant SLMs, head mounted displays and image displays will be developed and the scope of the terms SLMs, head mounted displays and image displays is intended to include all such new technologies a priori.

As used herein the term "about" refers to ±50%.

The terms "comprising", "including", "having" and their conjugates mean "including but not limited to".

The term "consisting of" is intended to mean "including and limited to".

The term "consisting essentially of" means that the composition, method or structure may include additional ingredients, steps and/or parts, but only if the additional ingredients, steps and/or parts do not materially alter the basic and novel characteristics of the claimed composition, method or structure.

As used herein, the singular form "a", "an" and "the" include plural references unless the context clearly dictates otherwise. For example, the term "a unit" or "at least one unit" may include a plurality of units, including combinations thereof.

The words "example" and "exemplary" are used herein to mean "serving as an example, instance or illustration". Any embodiment described as an "example or "exemplary" is not necessarily to be construed as preferred or advantageous over other embodiments and/or to exclude the incorporation of features from other embodiments.

The word "optionally" is used herein to mean "is provided in some embodiments and not provided in other embodiments". Any particular embodiment of the invention may include a plurality of "optional" features unless such features conflict.

Throughout this application, various embodiments of this invention may be presented in a range format. It should be understood that the description in range format is merely for convenience and brevity and should not be construed as an inflexible limitation on the scope of the invention. Accordingly, the description of a range should be considered to have specifically disclosed all the possible sub-ranges as well as individual numerical values within that range. For example, description of a range such as from 1 to 6 should be considered to have specifically disclosed sub-ranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals therebetween.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable sub-combination or as suitable in any other described embodiment of the invention. Certain features described in the context of various embodiments are not to be considered essential features of those embodiments, unless the embodiment is inoperative without those elements.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention. To the extent that section headings are used, they should not be construed as necessarily limiting.

What is claimed is:

1. A method for displaying a wide Field of View (FoV) scene including an interference based holographic image within the scene, comprising:
   setting pixel values in a Spatial Light Modulator (SLM) for producing a Computer Generated Hologram (CGH);
   illuminating the SLM with coherent light, thereby producing a first interference based holographic image;
   setting pixel values in a first additional SLM for producing a first additional image;
   illuminating the first additional SLM, thereby producing a first additional image; and
   allowing a real view of the real world to be viewable through and around the first holographic image and the first additional image,
   wherein
   the first holographic image is projected toward a viewer's fovea;
   the first additional image is displayed to a viewer's retina, outside the viewer's fovea, as part of the scene and adjacent to the first holographic image; and
   the real view of the real world is also viewable as part of the scene.

2. The method of claim 1, and further comprising:
   tracking a viewer's pupil; and
   controlling the displaying the first holographic image to direct the first holographic image to the viewer's pupil using a a direction-adjustable optical element.

3. The method of claim 1, in which the first additional image comprises a lower spatial resolution display than the first holographic image.

4. The method of claim 1, in which the first additional image comprises a stereoscopic image intended for one of the viewer's eyes.

5. The method of claim 1, in which the first additional image comprises an interference based holographic image.

6. The method of claim 1, in which:
   the displaying the first holographic image comprises displaying two first holographic images each one to each one of two eyes; and
   the displaying the second additional image adjacent to the first holographic image comprises displaying two first additional images, each one adjacent to each one of the first holographic images.

7. The method of claim 1, wherein:
   the producing the first interference based holographic image comprises producing an interference based three-dimensional holographic image; and
   the setting pixel values in the first additional SLM for producing the first additional image comprises setting pixel values in a first additional display.

8. A hybrid display for displaying a wide Field of View (FoV) scene including an interference based holographic image within the scene, comprising:
   a head mounted display (HMD) comprising:
   a first Spatial Light Modulator (SLM) for producing a first interference based holographic image;
   an optical system for:
   imaging the first holographic image toward a viewer's fovea;
   a second image display for producing at least a first additional real-time computer generated image adjacent to the first holographic image; and wherein the optical system is arranged to allow the viewer a real view of the real world through the optical system, thereby combining a view of the first holographic image, the first additional image and the real world.

9. The display of claim 8, and further comprising a focusing component for focusing light from the SLM onto a Fourier plane, and wherein the second image display is located at the Fourier plane.

10. The display of claim 8, in which the optical system is configured to display the first holographic image spanning a Field of View (FoV) of a human fovea.

11. The display of claim 8, and further comprising a viewer pupil tracking component for tracking the viewer's pupil and wherein the viewer pupil tracking component provides data for controlling the first Spatial Light Modulator (SLM) and the optical system for displaying the first holographic image to the viewer's pupil.

12. The display of claim 8, in which the second image display comprises a lower spatial resolution display than the first SLM.

13. The display of claim 8, in which the second image display comprises a display for producing a stereoscopic image.

14. The display of claim 8, in which the second image display comprises an SLM for producing a holographic image.

15. The display of claim 8, in which the optical system for producing the first holographic image and the second image display for producing the first additional image are configured to display the first holographic image and the first additional image spanning together a total angle in a range of 60-110 degrees.

16. The display of claim 8, in which the two SLMs, the two optical systems, and the two image displays are configured to display the first holographic image and the first additional image to the viewer's two eyes spanning an angle in a range of 90-200 degrees.

17. The hybrid display of claim 8 and further comprising a controllable tilting mirror, and wherein:
imaging the first holographic image toward a viewer's fovea comprises imaging the first holographic image on a controllable tilting mirror and re-imaging the first holographic image toward a viewer's fovea; and
the second image display is located adjacent to the controllable tilting mirror, arranged to display the first additional image adjacent to the first holographic image.

18. A display for displaying a wide Field of View (FoV) scene including a holographic image within the scene, comprising:
a first Spatial Light Modulator (SLM) and an optical system for producing a first holographic image at a center of a displayed scene; and
an image display for producing at least a first additional image adjacent to the first holographic image,
in which the optical system is configured to display the first holographic image spanning an angle in a range of 5-35 degrees.

19. The display of claim 18, in which the image display for producing at least a first additional image adjacent to the first holographic image is the first SLM, configured for also producing a second interference based holographic image adjacent to the first holographic image.

20. The display of claim 18, in which:
the first SLM and the optical system for producing the first holographic image comprises two SLMs and two optical systems, for producing two first holographic images, one for each one of a viewer's two eyes; and
the image display for producing the at least a first additional image adjacent to the first holographic image comprises two image displays for producing at least two first additional images each one adjacent to each one of the first holographic images.

21. A display for displaying a wide Field of View (FoV) scene including an interference based holographic image within the scene, comprising:
a first Spatial Light Modulator (SLM) and an optical system for producing a first interference based holographic image; and
a second image display for producing at least a first additional image imaged to a viewer's retina, outside the viewer's fovea, adjacent to the first holographic image.

22. A method for displaying a wide Field of View (FoV) scene including an interference based holographic image within the scene, comprising:
displaying a first interference based holographic image; and
displaying a first additional image as part of the displayed scene and adjacent to the first holographic image, in which the displaying the first additional image comprises displaying the first additional image to a viewer's retina outside a fovea of an eye of the viewer.

23. A method for displaying a wide Field of View (FoV) scene including a holographic image within the scene, comprising:
setting pixel values in a Spatial Light Modulator (SLM) for producing a Computer Generated Hologram (CGH);
illuminating the SLM with coherent light, thereby producing a first interference based holographic image;
setting pixel values in a first additional image display for producing a second image; and
illuminating the first additional image display, thereby producing a second additional image,
wherein
the first holographic image is displayed at a center of a scene; and
the second additional image is displayed to a viewer's retina, outside the viewer's fovea, as part of the scene and adjacent to the first holographic image.

* * * * *